(12) United States Patent
Ikedo et al.

(10) Patent No.: US 11,089,251 B2
(45) Date of Patent: Aug. 10, 2021

(54) IMAGE SENSOR AND IMAGE CAPTURING APPARATUS

(71) Applicant: CANON KABUSHIKI KAISHA, Tokyo (JP)

(72) Inventors: Hideki Ikedo, Kawasaki (JP); Hirokazu Kobayashi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/507,342

(22) Filed: Jul. 10, 2019

(65) Prior Publication Data
US 2020/0021767 A1   Jan. 16, 2020

(30) Foreign Application Priority Data

Jul. 12, 2018   (JP) .............................. JP2018-132641
Jun. 19, 2019   (JP) .............................. JP2019-113922

(51) Int. Cl.
*H04N 5/3745* (2011.01)
*H01L 27/146* (2006.01)
*H01L 31/107* (2006.01)
*H04N 5/378* (2011.01)

(52) U.S. Cl.
CPC ....... *H04N 5/3745* (2013.01); *H01L 27/1461* (2013.01); *H01L 27/14621* (2013.01); *H01L 27/14623* (2013.01); *H01L 27/14627* (2013.01); *H01L 31/107* (2013.01); *H04N 5/378* (2013.01)

(58) Field of Classification Search
None
See application file for complete search history.

(56) References Cited

U.S. PATENT DOCUMENTS

| 8,610,800 | B2 | 12/2013 | Ikedo |
| 8,816,443 | B2* | 8/2014 | Augusto ............. H01L 27/1203 257/399 |
| 9,191,595 | B2 | 11/2015 | Ikedo |
| 9,456,155 | B2 | 9/2016 | Kobayashi et al. |
| 9,560,297 | B2 | 1/2017 | Ikedo |
| 9,571,718 | B2 | 2/2017 | Suzuki et al. |
| 10,313,588 | B2 | 6/2019 | Ikedo |
| 10,533,893 | B2* | 1/2020 | Leonardo ................ G01T 1/17 |
| 10,784,302 | B1* | 9/2020 | Boettiger ......... H01L 31/02327 |

(Continued)

FOREIGN PATENT DOCUMENTS

JP   2012174783 A   9/2012

*Primary Examiner* — James M Hannett
(74) *Attorney, Agent, or Firm* — Carter, DeLuca & Farrell LLP

(57) ABSTRACT

An image sensor of a photon counting type that suppresses a reduction in the efficiency of photon detection dependent on a pixel position, is disclosed. The image sensor comprising a pixel region in which a plurality of pixels are arrayed in a matrix, each pixel including a photoelectric conversion region and an avalanche breakdown region. In a plan view of a pixel, a size of the avalanche breakdown region is smaller than a size of the photoelectric conversion region. In addition, at least some of pixels arranged in a peripheral region of the pixel region, the avalanche breakdown region is formed such that a position thereof is shifted with respect to a position of the avalanche breakdown region in pixels arranged in a central region of the pixel region.

18 Claims, 16 Drawing Sheets

(56) References Cited

U.S. PATENT DOCUMENTS

| | | |
|---|---|---|
| 2012/0075615 A1* | 3/2012 | Niclass .................. G01S 17/10 |
| | | 356/5.01 |
| 2013/0223124 A1* | 8/2013 | Park ....................... G11C 11/16 |
| | | 365/96 |
| 2015/0115131 A1* | 4/2015 | Webster ............ H01L 27/14603 |
| | | 250/208.1 |
| 2017/0126967 A1 | 5/2017 | Suzuki et al. |
| 2018/0343406 A1 | 11/2018 | Ikedo |
| 2019/0014281 A1 | 1/2019 | Kobayashi et al. |
| 2020/0286944 A1* | 9/2020 | Boettiger ............. H01L 31/107 |

\* cited by examiner

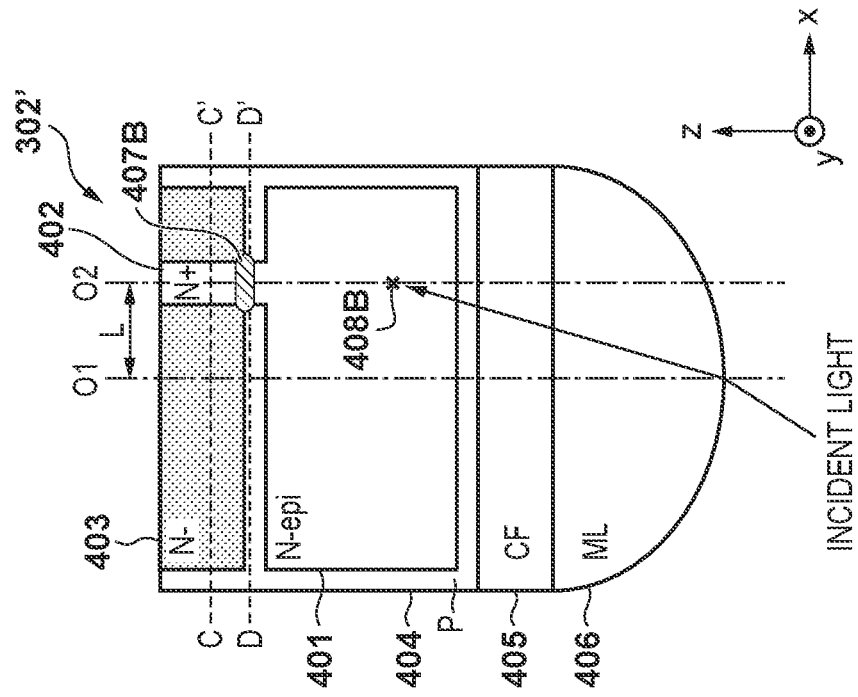
F I G. 5A
PIXEL IN VICINITY OF OPTICAL AXIS CENTER
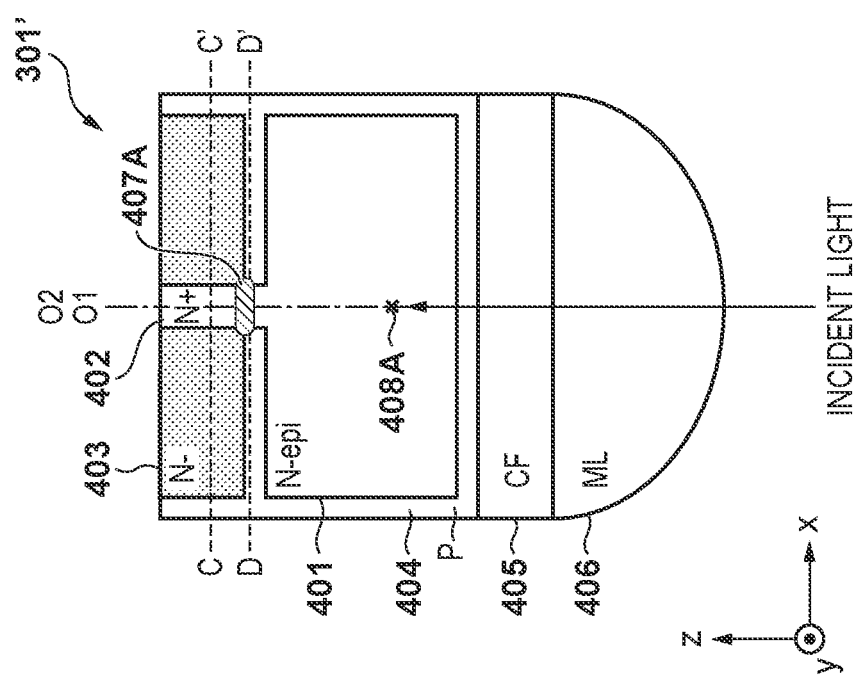
F I G. 5B
PIXEL IN PERIPHERAL AREA

PIXEL IN VICINITY OF OPTICAL AXIS CENTER

PIXEL IN PERIPHERAL AREA

PIXEL IN NEAR-OPTICAL AXIS CENTER AREA

PIXEL IN INTERMEDIATE AREAS

PIXEL IN PERIPHERAL AREA

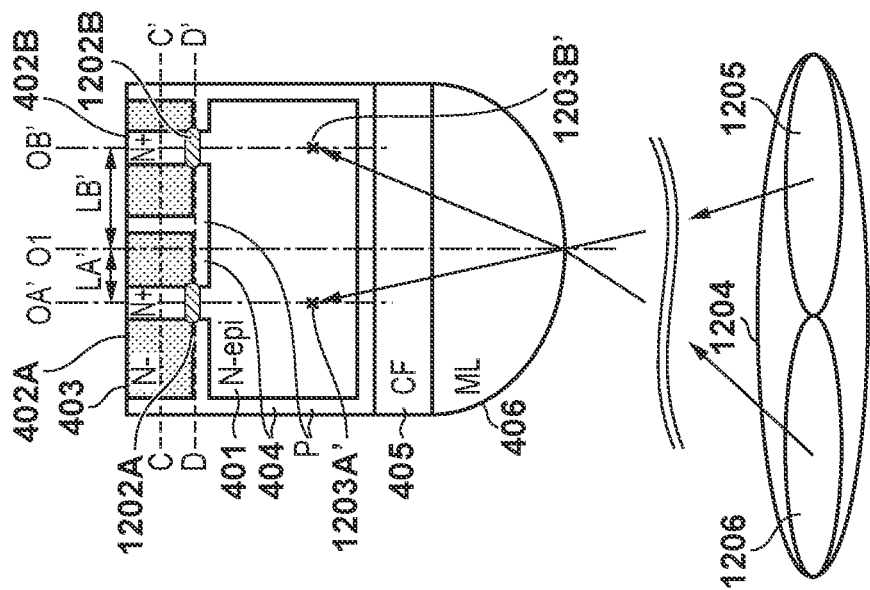
FIG. 9A PIXEL IN VICINITY OF OPTICAL AXIS CENTER
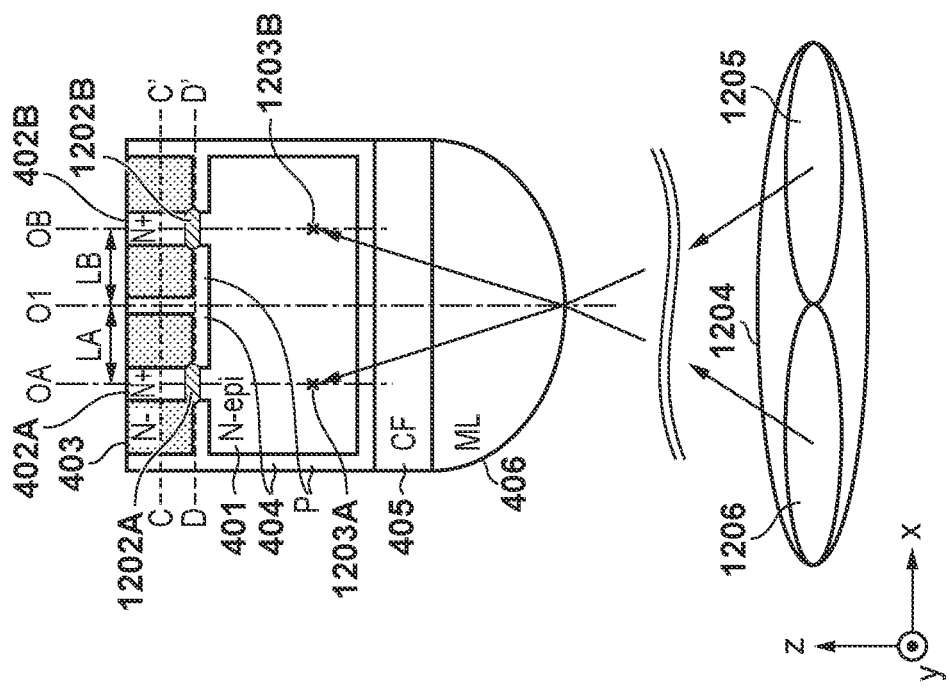
FIG. 9B PIXEL IN PERIPHERAL AREA

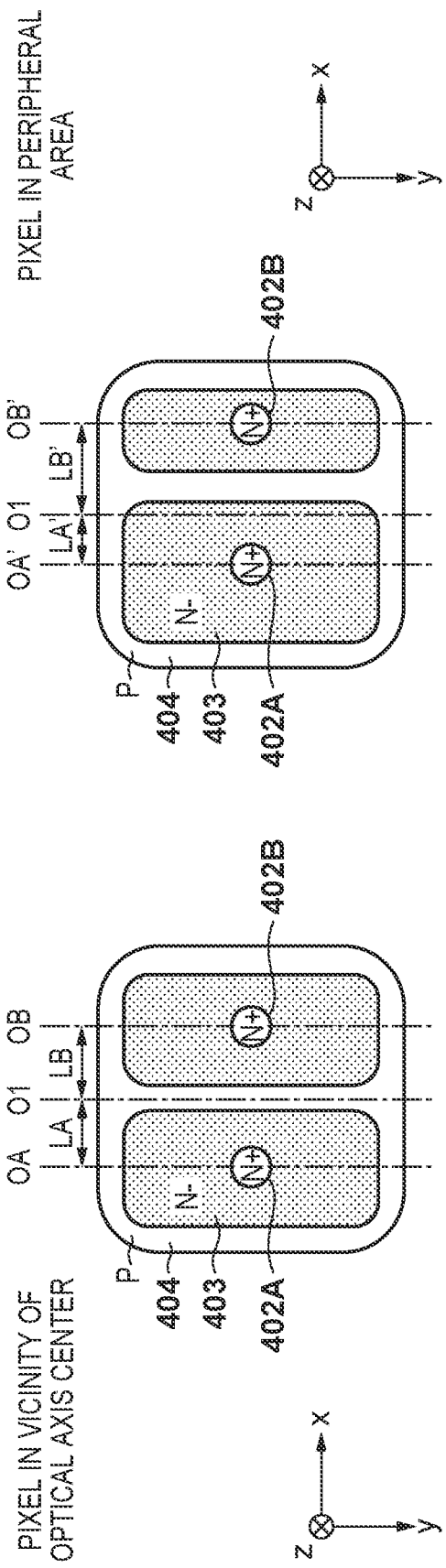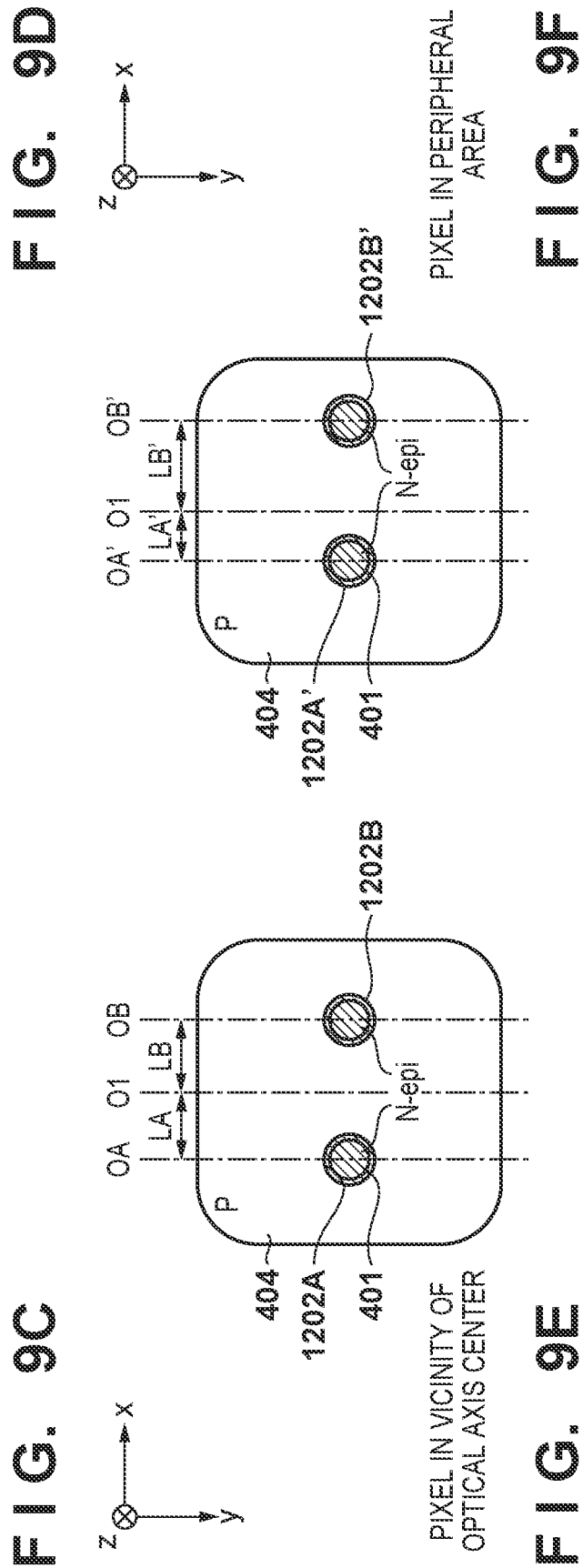
FIG. 9C  FIG. 9D
FIG. 9E  FIG. 9F

ENTIRE PIXEL REGION

REGION IN VICINITY OF
OPTICAL AXIS CENTER

PERIPHERAL REGION

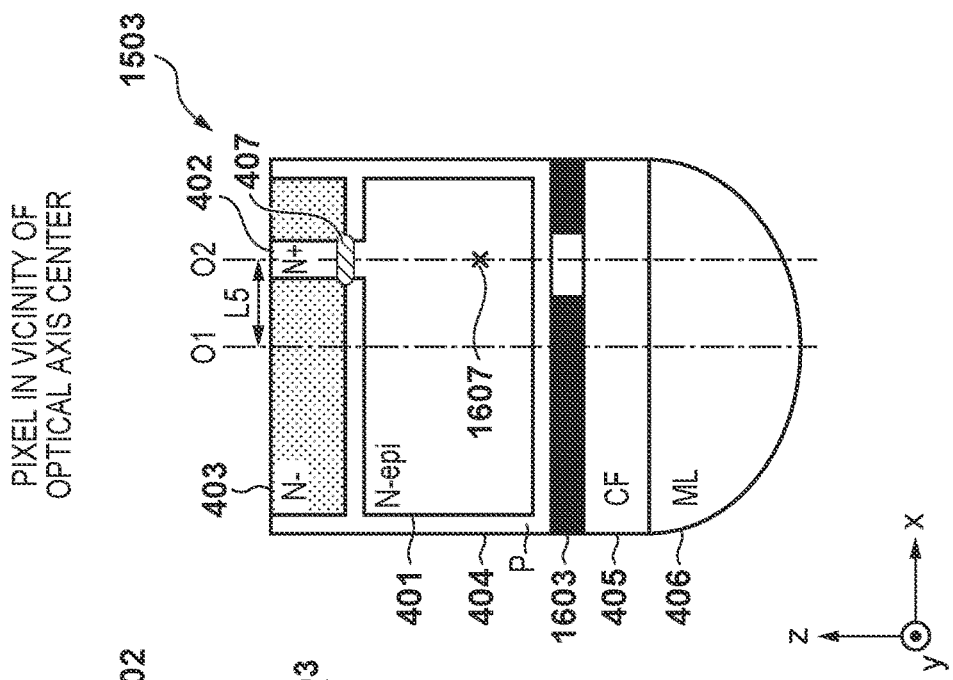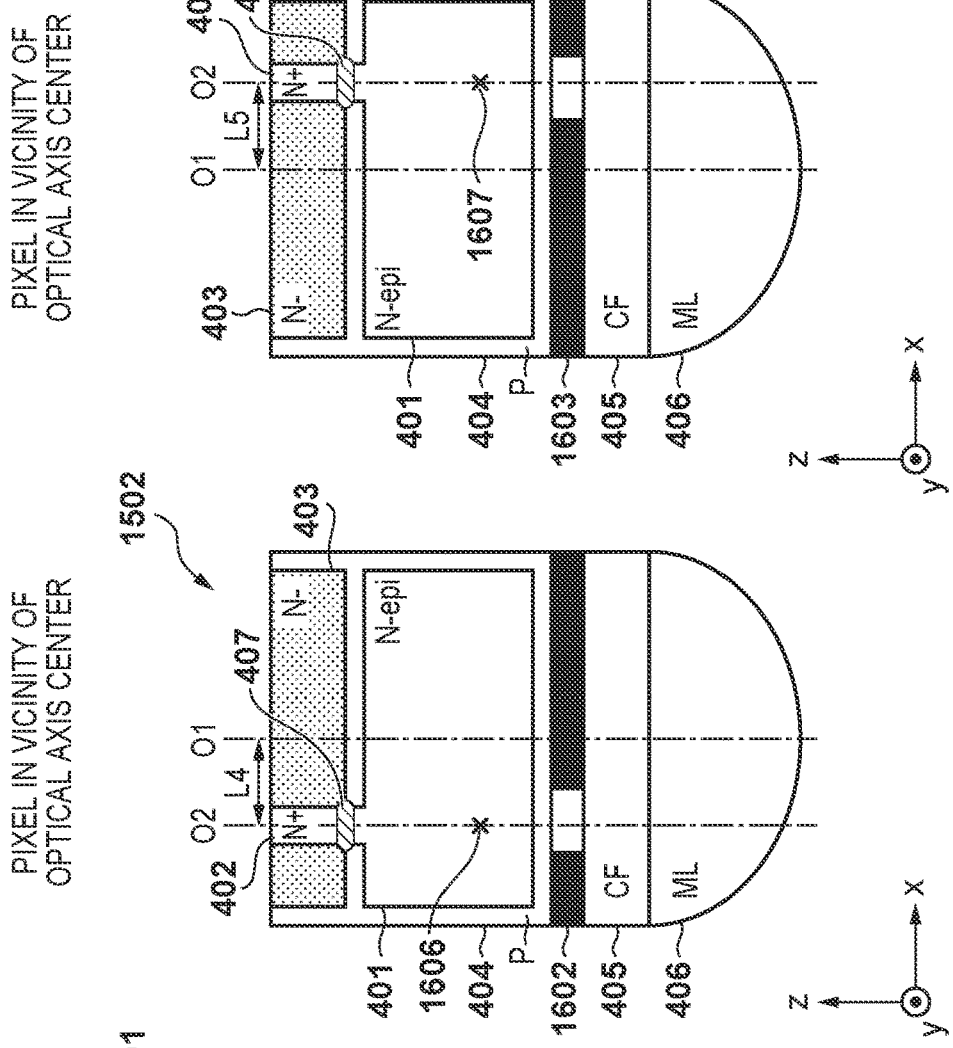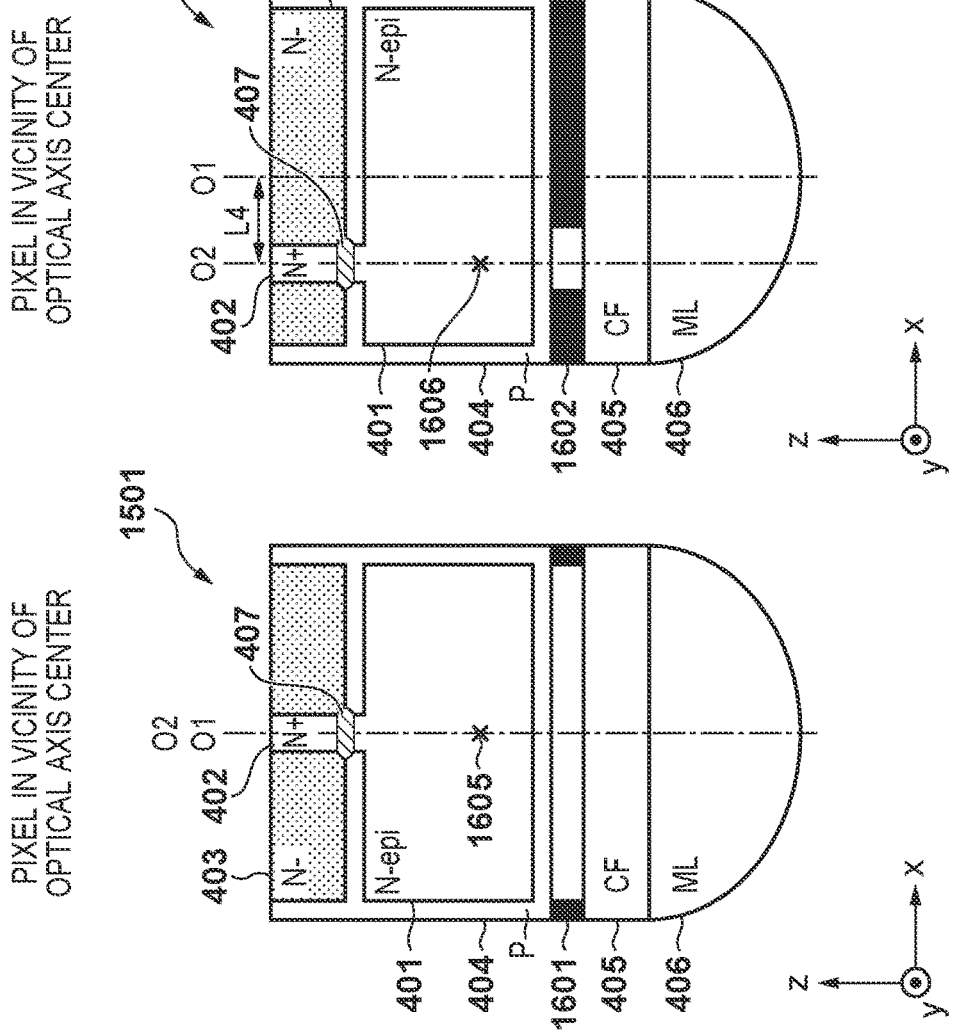

PIXEL IN VICINITY OF OPTICAL AXIS CENTER

PIXEL IN PERIPHERAL AREA

PIXEL IN PERIPHERAL AREA

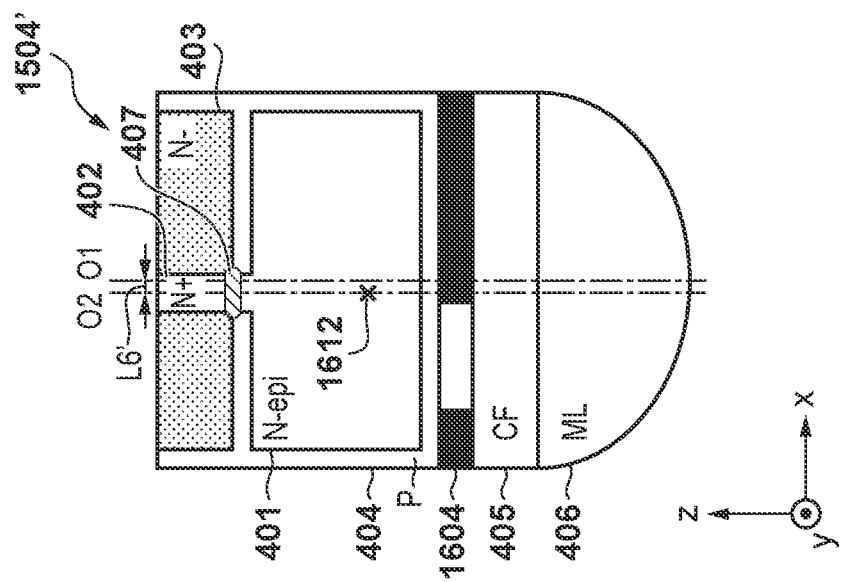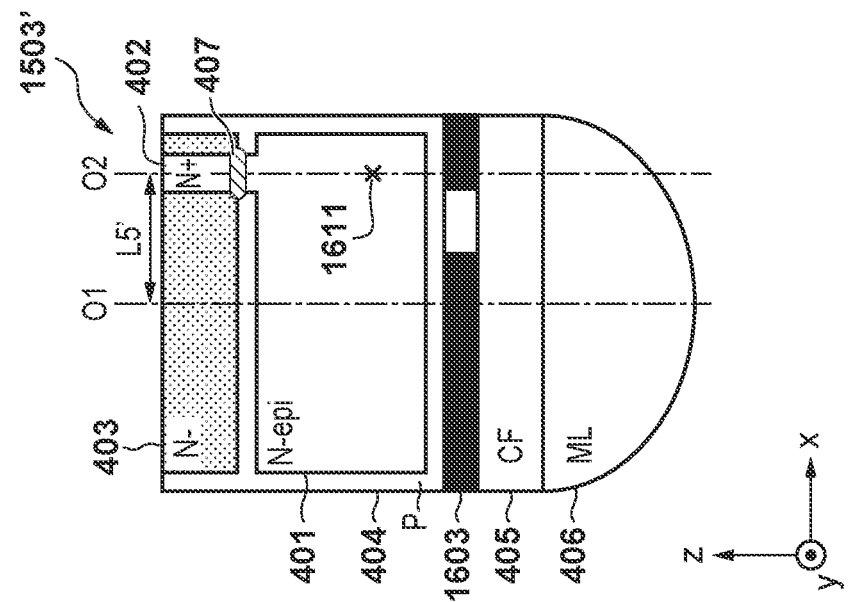

IMAGE SENSOR AND IMAGE CAPTURING APPARATUS

BACKGROUND OF THE INVENTION

Field of the Invention

The present invention relates to an image sensor and an image capturing apparatus, and in particular to a structure of an image sensor.

Description of the Related Art

A photodiode array has been suggested that includes an array of avalanche photodiodes (APDs) to which a reverse bias voltage higher than a breakdown voltage has been applied, and that detects the number of photons incident on a certain range (Japanese Patent Laid-Open No. 2012-174783). The use of such a photodiode array as an image sensor of a photon counting type has also been suggested.

APDs to which a reverse bias voltage higher than a breakdown voltage has been applied generate a light current through avalanche breakdown each time photons are incident. The number of photons incident on the APDs can be detected by shaping voltage changes associated with the generation of the light current into pulse signals and counting the generated pulse signals using a counter. For example, as the number of pulses counted during an exposure period is equivalent to the amount of incident light during the exposure period, a counted value of the counter can be used as pixel data. As there is no need to perform charge transfer and the like, pixel data that is less affected by a circuit noise can be obtained compared to a conventional CCD or CMOS image sensor, and this is advantageous in, for example, shooting in a dark place.

If a dark current is generated due to a crystal defect and the like in a high-field region in which avalanche breakdown occurs in APDs, pulse signals based on the dark current are counted. By reducing the area of the high-field region without changing the area of a light-receiving region in which carriers are generated by photon incidence, the probability that the crystal defect and the like are included inside the high-field region can be lowered, thereby suppressing false detection.

In the case of an image sensor that is formed to include an array of APDs as pixels, although a pixel arranged in a position with a small image height has light incident thereon substantially from the front of the pixel, a pixel arranged in a position with a large image height has light incident thereon from an oblique direction. That is, depending on the image height of a pixel, the incident angle and the incident position of light with respect to the light-receiving region vary. This means that the position where carriers are generated by incident photons within a pixel varies depending on the image height of a pixel.

Therefore, when the high-field region is formed to have a small area in order to suppress the generation of the dark current, the moving distance and direction that are necessary for carriers to reach the high-field region vary depending on a pixel. This gives rise to the possibility that carriers cannot be accelerated to the speed that is necessary for avalanche breakdown to occur in the high-field region. Furthermore, in a pixel in which carriers move a long distance to the high-field region, the probability that the carriers recombine and disappear before they reach the high-field region increases, which can cause a reduction in the efficiency of detection of incident photons.

SUMMARY OF THE INVENTION

The present invention has been made in view of the aforementioned problems with conventional techniques. The present invention provides an image sensor of a photon counting type that suppresses a reduction in the efficiency of photon detection dependent on a pixel position.

According to an aspect of the present invention, there is provided an image sensor comprising: a pixel region in which a plurality of pixels are arrayed in a matrix, each pixel including a photoelectric conversion region that generates charges through photoelectric conversion of incident light, and an avalanche breakdown region in which avalanche breakdown occurs due to the charges generated by the photoelectric conversion, wherein in a plan view of each pixel arrayed in the pixel region, a size of the avalanche breakdown region is smaller than a size of the photoelectric conversion region, and in at least some of pixels that are arranged in a peripheral region of the pixel region among the pixels arrayed in the pixel region, the avalanche breakdown region is formed in such a manner that a position thereof is shifted with respect to a position of the avalanche breakdown region in pixels arranged in a central region of the pixel region.

According to another aspect of the present invention, there is provided an image sensor comprising: a pixel region in which a plurality of pixels are arrayed, each pixel including an avalanche breakdown region in which avalanche breakdown occurs due to charges generated by photoelectric conversion, and an electrode for applying a voltage for the avalanche breakdown, wherein in at least partial pixels among the pixels arrayed in the pixel region, the electrode is formed in such a manner that a position thereof is different from a position of the electrode in other pixels.

According to a further aspect of the present invention, there is provided an image sensor comprising: a pixel region in which a plurality of pixels are arrayed, each pixel including an avalanche breakdown region in which avalanche breakdown occurs due to charges generated by photoelectric conversion, wherein in at least partial pixels among the pixels arrayed in the pixel region, the avalanche breakdown region is formed in such a manner that a position thereof is different from a position of the avalanche breakdown region in other pixels.

According to another aspect of the present invention, there is provided an image capturing apparatus, comprising: an image sensor; and a processor for controlling a readout mode of the image sensor, wherein the image sensor comprises: a pixel region in which a plurality of pixels are arrayed in a matrix, each pixel including a photoelectric conversion region that generates charges through photoelectric conversion of incident light, and an avalanche breakdown region in which avalanche breakdown occurs due to the charges generated by the photoelectric conversion, wherein in a plan view of each pixel arrayed in the pixel region, a size of the avalanche breakdown region is smaller than a size of the photoelectric conversion region, and in at least some of pixels that are arranged in a peripheral region of the pixel region among the pixels arrayed in the pixel region, the avalanche breakdown region is formed in such a manner that a position thereof is shifted with respect to a position of the avalanche breakdown region in pixels arranged in a central region of the pixel region.

Further features of the present invention will become apparent from the following description of exemplary embodiments with reference to the attached drawings.

BRIEF DESCRIPTION OF THE DRAWINGS

FIGS. 5A and 5B are cross-sectional views of photodiodes in an exemplary modification of the first embodiment.

FIGS. 9A to 9F are cross-sectional views of photodiodes in the second embodiment.

FIGS. 11A to 11H are x-z cross-sectional views of photodiodes in the third embodiment.

DESCRIPTION OF THE EMBODIMENTS

Exemplary embodiments of the present invention will now be described in detail in accordance with the accompanying drawings. The following embodiments describe, as examples of an image sensor of a photon counting type, configurations that use avalanche photodiodes (APDs) as photoelectric converters. However, the configurations may use other photoelectric converters.

First Embodiment

Figure 1:
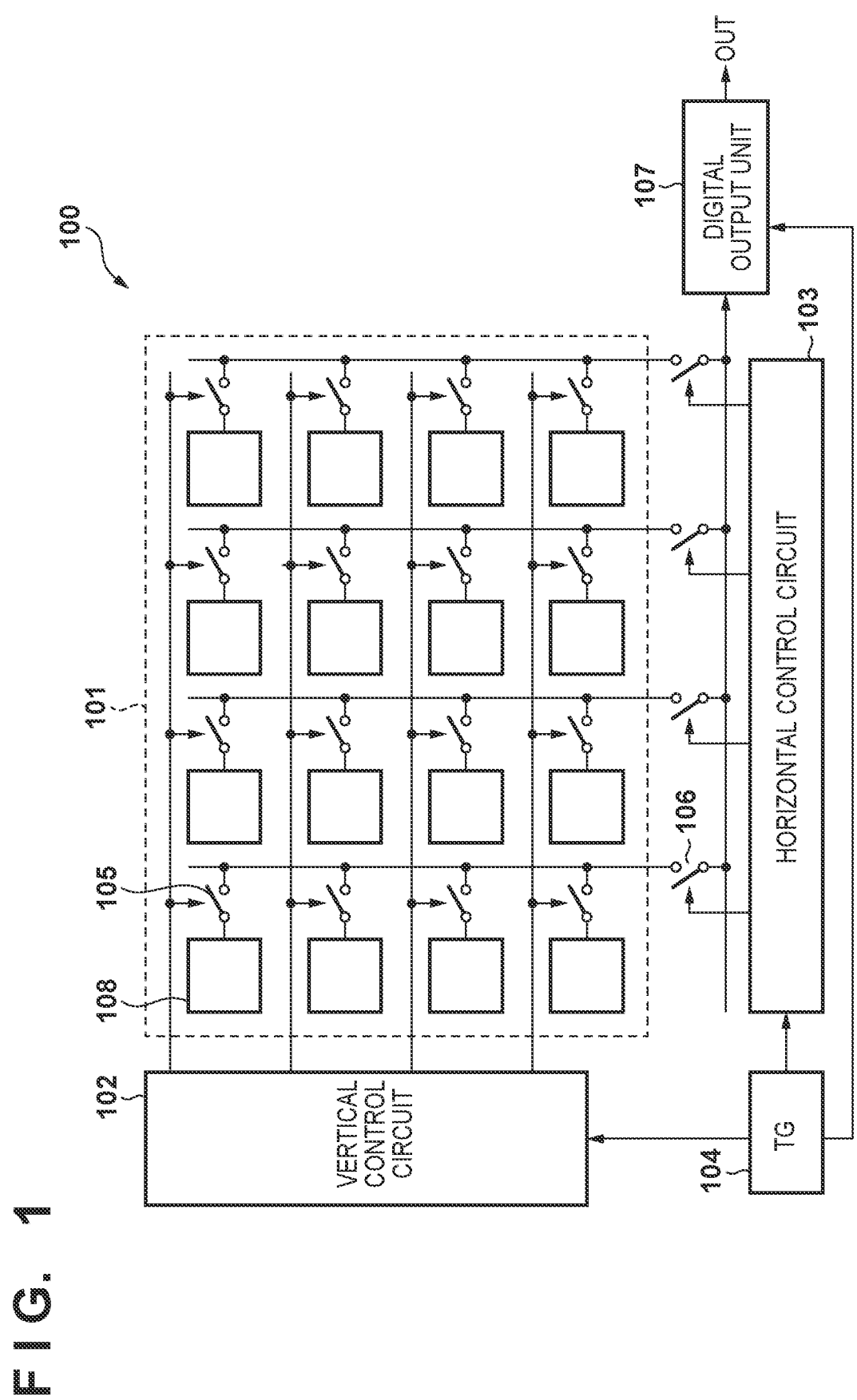
FIG. 1 is a diagram showing an exemplary overall configuration of an image sensor of a first embodiment.

FIG. 1 schematically shows an exemplary configuration of an image sensor according to an embodiment of the present invention. An image sensor 100 includes a pixel region 101, a vertical control circuit 102, a horizontal control circuit 103, a timing generator (TG) 104, and a digital output unit 107.

In the pixel region 101, a plurality of pixels 108 are arranged in a matrix. Although four pixels are arrayed in a horizontal direction and four pixels are arrayed in a vertical direction in the illustrated pixel region 101 for ease of explanation, a large number of pixels, such as several millions to tens of millions of pixels, are arrayed in reality. The pixels 108 count pulse signals attributed to incident photons, and output a counted value in a digital form as pixel data. The specifics of these pixels will be described later using FIG. 2.

The vertical control circuit 102 selects pixels 108 on a row-by-row basis using switches 105. The vertical control circuit 102 also transmits a control signal to pixels 108 on a row-by-row basis via non-illustrated wires. The specifics of this control signal will be described later using FIG. 2.

The horizontal control circuit 103 selects pixels 108 on a column-by-column basis using switches 106. Pixel data of one pixel 108 that has been selected by both of the vertical control circuit 102 and the horizontal control circuit 103 is output to the digital output unit 107.

The digital output unit 107 sequentially outputs pixel data output from the pixels 108 to the outside of the image sensor 100.

The TG 104 outputs, to the vertical control circuit 102 and the horizontal control circuit 103, a control signal for causing the pixels 108 to output pixel data. Note that the TG 104 also transmits a control signal to the digital output unit 107.

Figure 2:
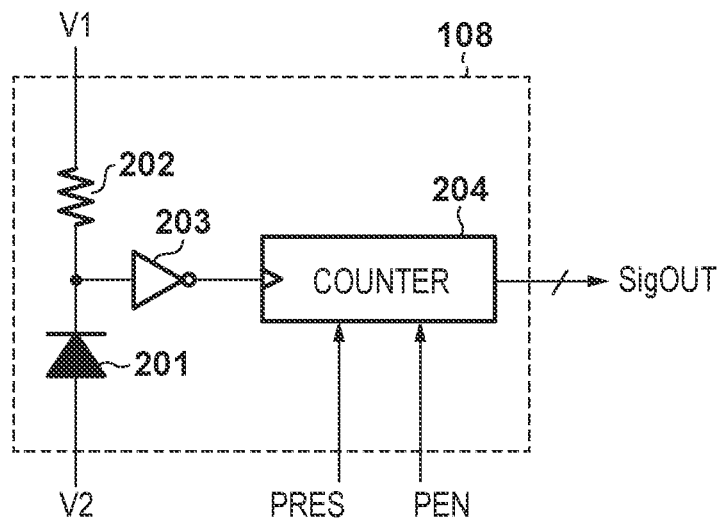
FIG. 2 is an equivalent circuit diagram of a unit pixel of the first embodiment.

FIG. 2 is an equivalent circuit diagram of the pixels 108. The pixels 108 include a photodiode 201, a quenching resistor 202, an inverting buffer 203, and a counter circuit 204. Note that the image sensor 100 can be realized by three-dimensional mounting whereby, among the constituent elements of the pixels 108, the photodiode 201 and the counter circuit 204 are formed on separate chips, and inter-chip signals are electrically connected by a through-silicon via (TSV) or the like. This can suppress a reduction in an aperture ratio of the photodiode 201.

The photodiode 201 is, for example, an avalanche photodiode (APD), and functions as a photoelectric conversion unit. A voltage V1 is applied to a cathode terminal of the photodiode 201 via the quenching resistor 202. A voltage V2 is applied to an anode terminal of the photodiode 201. The voltages V1 and V2 are determined so as to apply a reverse bias voltage higher than a breakdown voltage to the photodiode 201. It will be assumed here that V1=3 V and V2=−20 V, for example. Note that in the present embodiment, the voltage V2 is equivalent to a ground voltage in the photodiode 201.

As a result, the photodiode 201 operates in a Geiger-mode, and upon photon incidence, carriers generated by photoelectric conversion trigger avalanche breakdown and a large light current flows, thereby causing a voltage drop in the quenching resistor 202. This reduces a cathode terminal voltage in the photodiode 201, and the avalanche breakdown stops when the reverse bias voltage applied to the photodiode 201 falls below the breakdown voltage. Consequently, the light current stops flowing, and the cathode terminal voltage of the photodiode 201 is restored to V1. In the above-described manner, single photon incidence causes a large voltage change in a short amount of time. This voltage change is output by the inverting buffer 203 as a pulse signal. The quenching resistor 202 is a resistor element for stopping the avalanche breakdown of the photodiode 201. The quenching resistor 202 may be realized using a resistor component of a transistor.

The counter circuit 204 counts pulse signals that are output from the inverting buffer 203 each time photons are incident. The vertical control circuit 102 supplies an enable signal (PEN signal) and a reset signal (PRES signal) to the counter circuit 204. When a pulse signal is input to the counter circuit 204 in a state where the PEN signal is at an H level, the counted value is incremented by one. In a state where the PEN signal is at an L level, the counted value is not incremented and the current counted value is maintained, even if a pulse signal is input. Furthermore, when the PRES signal supplied to the counter circuit 204 has become the H level, the counted value of the counter circuit 204 is reset to 0. As the counted value of the counter circuit 204 during a predetermined exposure period represents a value corresponding to the amount of received light in the photodiode 201 during the exposure period, the counted value can be used as pixel data.

After the predetermined exposure period has ended, the counted value of the counter circuit 204 in a pixel that has been selected by both of the vertical control circuit 102 and the horizontal control circuit 103 is output to the digital output unit 107 as pixel data.

Figure 3:
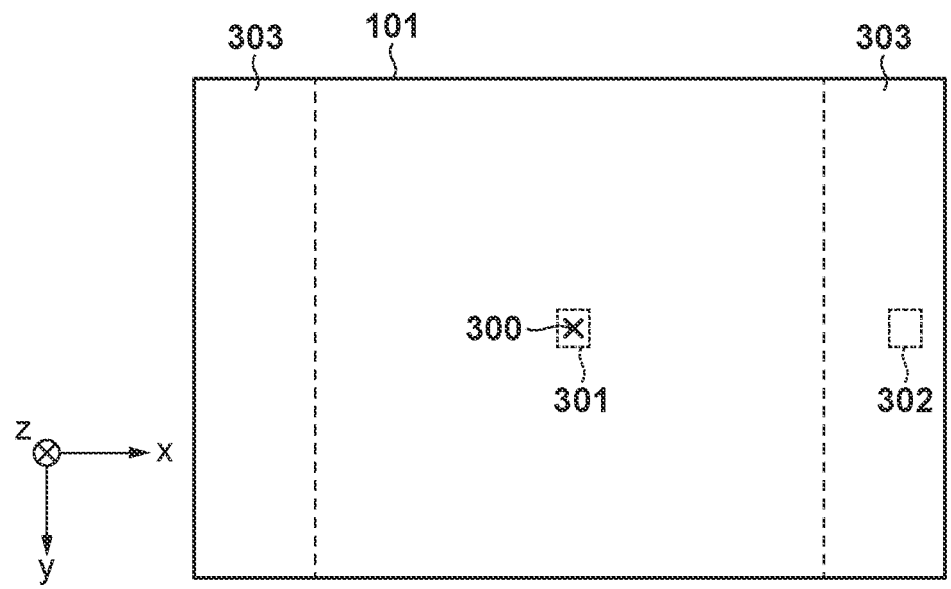
FIG. 3 is a general configuration diagram of a pixel region of the first embodiment.

FIG. 3 shows an example of a general configuration of the pixel region 101. Here, as shown in the figure, an x-axis, a y-axis, and a z-axis are defined for the pixel region 101 respectively in a horizontal direction, a vertical direction, and a direction normal to a pixel region surface. It will be assumed that light is incident on the pixel region in a positive direction of the z-axis (from the front of the sheet). An optical axis of an imaging optical system, such as a lens unit, intersects with the pixel region 101 at an intersection point 300. The intersection point 300 will be referred to as the optical axis center of the pixel region 101. On the other hand, the center of the pixel region 101 will be referred to as the image center. The optical axis center and the image center are reference positions of the pixel region. It will be assumed here that the optical axis center and the image center match, although they need not match. Therefore, in the following description, the optical axis center is also the image center. Reference sign 301 denotes an example of a pixel including the optical axis center, and reference sign 302 denotes an example of a pixel that is at a long distance from the optical axis center (has a large image height) and is in a peripheral area of the pixel region. It will also be assumed that the pixels 301 and 302 have the same y-coordinate. Note that in some cases, there is a shift between the optical axis center and the image center due to manufacturing error, optical camera shake correction, and the like. However, the shift between the optical axis center and the image center due to these factors is extremely small relative to the size of the pixel region 101. Therefore, the present embodiment will be described under the assumption that the optical axis center and the image center match for ease of explanation and understanding. Furthermore, in some cases, the pixel region 101 includes pixels from which entrance of light is blocked and dummy pixels, in addition to light-receiving pixels for receiving light via the imaging optical system. The image center in the present invention can be the center of a region of the light-receiving pixels excluding the pixels from which entrance of light is blocked and the dummy pixels.

Note that here, in this pixel region 101, regions denoted by reference sign 303 are regarded as peripheral areas, and the rest is regarded as the vicinity of the optical axis center or a center region. Also note that boundaries between the peripheral areas 303 and the vicinity of the optical axis center can be determined by, for example, whether the incident angle of a light ray incident on the center of a pixel (in the x-axis direction) is equal to or larger than a threshold, but may be determined in accordance with other conditions. For example, an area comprised of pixels that are distant from the optical axis center by a threshold or more can be considered as the peripheral area 303. Hereinafter, the pixel 301 will be described as a pixel that represents pixels included in the vicinity of the optical axis center, and the pixel 302 will be described as a pixel that represents pixels included in the peripheral areas 303.

Figure 4A:
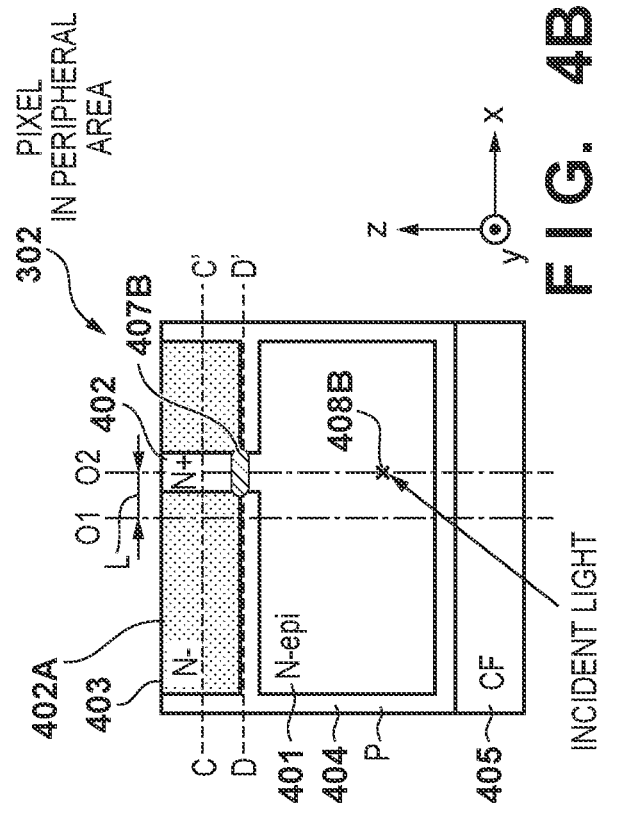
FIGS. 4A to 4H are cross-sectional views of photodiodes of the first embodiment.
Figure 4C:
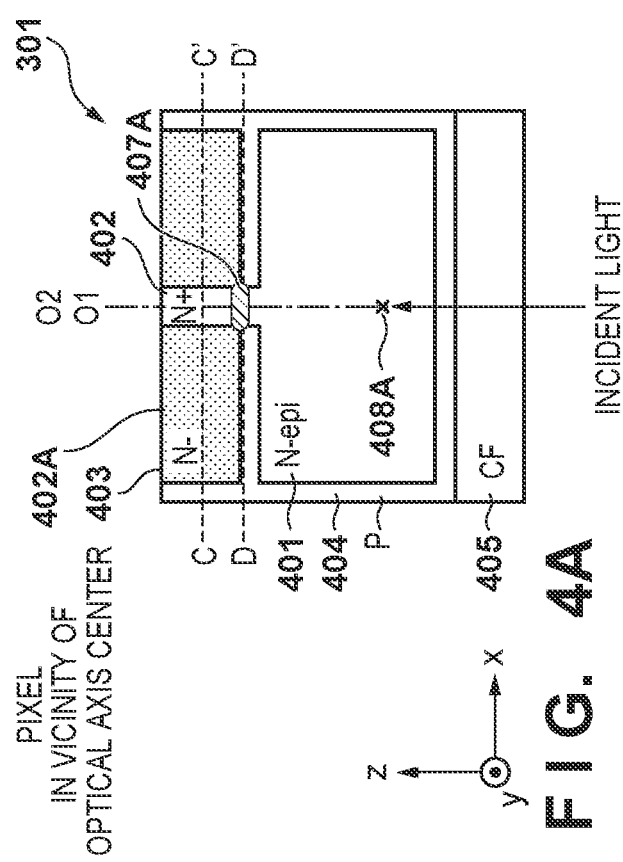
Figure 4B:
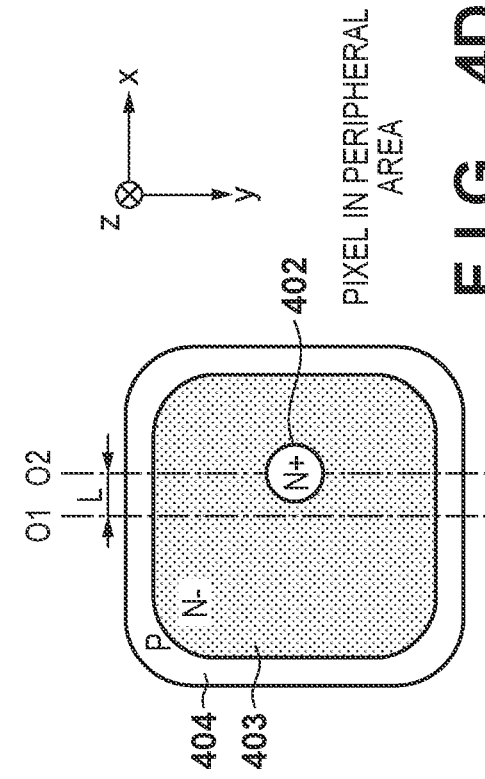
Figure 4D:
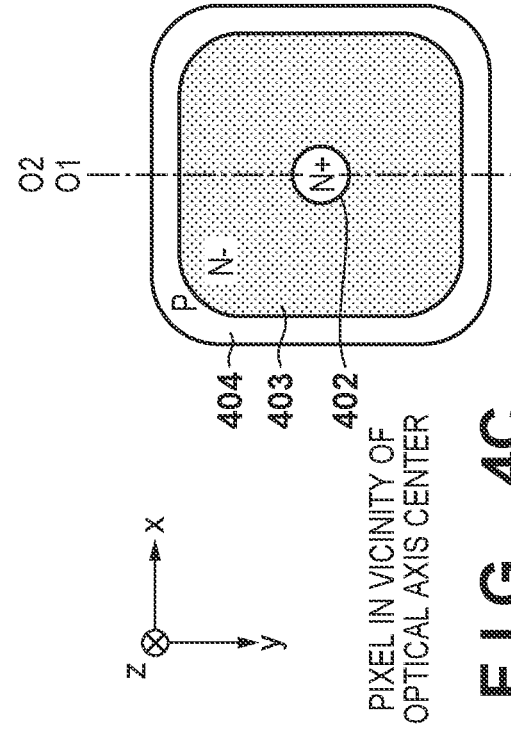

FIGS. 4A and 4B are x-z cross-sectional views of photodiodes in the pixels 301 and 302, respectively, in the present embodiment. It will be assumed here that the image sensor is of a back-illuminated type. Furthermore, FIGS. 4C and 4D are cross-sectional views taken along the line C-C' in FIGS. 4A and 4B, and FIGS. 4E and 4F are cross-sectional views taken along the line D-D' in FIGS. 4A and 4B. FIGS. 4G and 4H are plan views of photodiodes in the pixels 301 and 302, respectively. Note that x-y cross-sectional views of photodiodes such as those shown in FIGS. 4C to 4F can also be considered as kinds of plan views of photodiodes in the pixels 301 and 302.

In FIG. 4A, the voltage V2 (e.g., −20 V) is applied to P 404, which is a p-type semiconductor region serving as a second conductive type region, via a non-illustrated contact electrode. P 404 functions as an anode terminal of a p-n junction photodiode formed between itself and an n-type semiconductor region, which will be described later. Note that an electrode that applies the voltage V2 may be provided on a per-photodiode basis, or may be provided as a shared electrode for a plurality of photodiodes. Note that in either case, as the voltage V2 is a ground voltage in the photodiodes, it is desirable that the electrode that applies the voltage V2 is provided in cyclic positions with respect to the photodiodes that are arranged cyclically. Furthermore, when the electrode is provided as a shared electrode for a plurality of photodiodes, the electrode may be provided in correspondence with a plurality of photodiodes provided with a color filter of the same color (e.g., blue), for example.

The voltage V1 (e.g., 3 V) is applied to N+ 402, which is an n-type semiconductor region serving as a first conductive type region, via the quenching resistor 202. N+ 402, which is the n-type semiconductor region, functions as a cathode terminal of the p-n junction photodiode formed between itself and P 404. Furthermore, a non-illustrated electrode that applies the voltage V1 is provided in the vicinity of the center of an upper surface of N+ 402.

N-epi 401, which is an n-type epitaxial layer serving as a first conductive type, functions as a light-receiving region and a photoelectric conversion region. In N-epi 401, a depletion region is formed between N+ 402 to which the voltage V1 is applied and P 404 to which the voltage V2 is applied. N-epi 401 generates electron-hole pairs by photoelectrically converting incident photons. Of the electron-hole pairs, holes move to P 404 by drifting, and are discharged to the outside of the image sensor via a non-illustrated contact electrode. On the other hand, electrons move to a high-field region 407A by drifting, and trigger avalanche breakdown by getting accelerated. Hereinafter, the high-field region 407A for causing this avalanche breakdown will be referred to as an avalanche breakdown region. Note that in order to efficiently collect electrons into the high-field region 407A, an appropriate potential gradient can be provided inside N-epi 401.

Figure 4E:
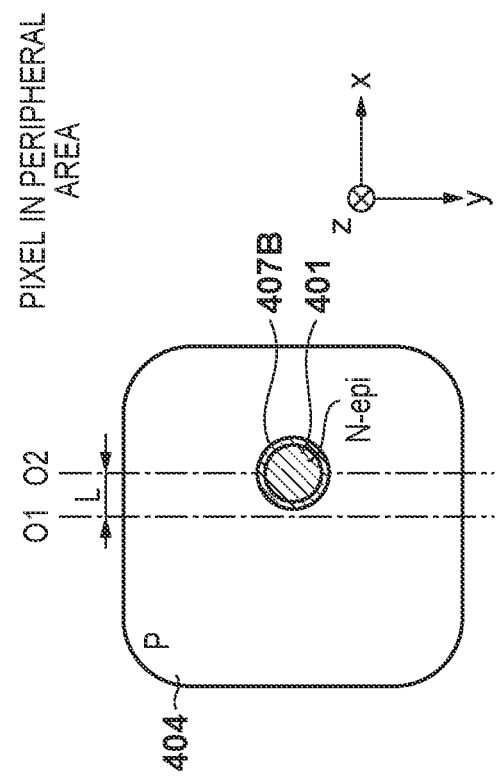

As shown in the D-D' cross-sectional view of FIG. 4E, P 404 is formed so as to extend to the vicinity of the center of the photodiode, and the avalanche breakdown region 407A is formed in a region in which P 404 and N+ 402 are close to each other. In the present embodiment, as shown in FIG. 4A, the area in which the avalanche breakdown region is formed is made small by forming N+ 402 only in the vicinity of the center inside the pixel. This can lower the probability that the avalanche breakdown region is formed in a region in which a crystal defect and the like exist inside a silicon substrate. As a result, it is possible to lower the rate of occurrence of pixels in which a dark current, which is generated due to a crystal defect and the like inside the avalanche breakdown region, undergoes avalanche breakdown and is detected with a high frequency (defective pixels). Furthermore, even if the area of the avalanche breakdown region is made small, it is possible to detect photons incident on a wide range inside the pixel by increasing the area of N-epi 401, which is the light-receiving region.

A guard ring N– 403 is a first conductive type region with a lower concentration than N+ 402. As shown in the C-C' cross-sectional view of FIG. 4C, the guard ring N– 403 is formed between N+ 402 and P 404, and has a function of preventing edge breakdown by alleviating an electric field between N+ 402 and P 404. Note that in order to achieve the advantageous effect of preventing edge breakdown with the aid of the guard ring N– 403, the guard ring N–403 is placed so as to provide a distance of a certain extent (e.g., 1.4 μm or more) between N+ 402 and P 404 in FIG. 4C. Also note that the distance by which N+ 402 and P 404 are apart from each other via the guard ring N– 403 can be changed depending on the values of voltages applied to the photodiode.

CF 405 is a color filter. In the present embodiment, color filters that each have one of a plurality of colors (e.g., three primary colors of red, green, and blue) are respectively provided in the pixels so as to form a specific array (e.g., a Bayer array).

Here, the reason why the photodiode of the back-illuminated type is used in the present embodiment is because the efficiency of detection of photons incident on the guard ring N– 403 is extremely low. Most of the electrons generated by photoelectric conversion in the guard ring N– 403 move directly to N+ 402 by drifting without reaching the avalanche breakdown region 407A. Therefore, if the photodiode is configured as a front-illuminated type in which light is made incident from the side where the guard ring N– 403 is formed, the efficiency of detection of short-wavelength light that is photoelectrically converted in the vicinity of the front surface of the photodiode is reduced. Thus, the reduction in the efficiency of detection of short-wavelength light can be suppressed by using the photodiode of the back-illuminated type as shown in FIGS. 4A to 4H. Note that a change in the electric field intensity in each region of the photodiode can be smoothed by forming the photodiode in a shape of a hollow cylinder. When the photodiode is formed in a shape of a hollow cylinder, as the light-receiving area of N-epi 401 becomes small, a light-collecting structure, such as a waveguide, may be provided.

As shown in FIGS. 4A and 4B, the position where N+ 402 is formed, that is, the position where the avalanche breakdown region 407A is formed differs between the pixel 301 located at the optical axis center and the pixel 302 in the peripheral area 303. Here, the central position of N-epi 401 in the x-axis direction is denoted by O1. Provided that the width of N-epi 401 in the x-axis direction is W, O1 is equivalent to a position W/2. Similarly, the central position of N+ 402 in the x-axis direction is denoted by O2.

As shown in FIG. 4C, in the pixel 301 located at the optical axis center, the central position O2 of N+ 402 is the same as the central position O1 of N-epi 401. On the other hand, as shown in FIG. 4D, in the pixel 302 in the peripheral area 303, the central position O2 of N+ 402 is formed at a position that is shifted from the central position O1 of N-epi 401 by a distance L in the x-axis direction (that is, O2=O1+ L). Note that as the pixels 301 and 302 have the same y-axis coordinate here, the central position of N+ 402 and the central position of N-epi 401 in the y-axis direction are the same irrespective of the image heights of the pixels. However, when the pixels 301 and 302 have different y-axis coordinates, the central position of N+ 402 and the central position of N-epi 401 in the y-axis direction can be changed in accordance with the magnitude of the difference between the y-axis coordinates.

Figure 4F:
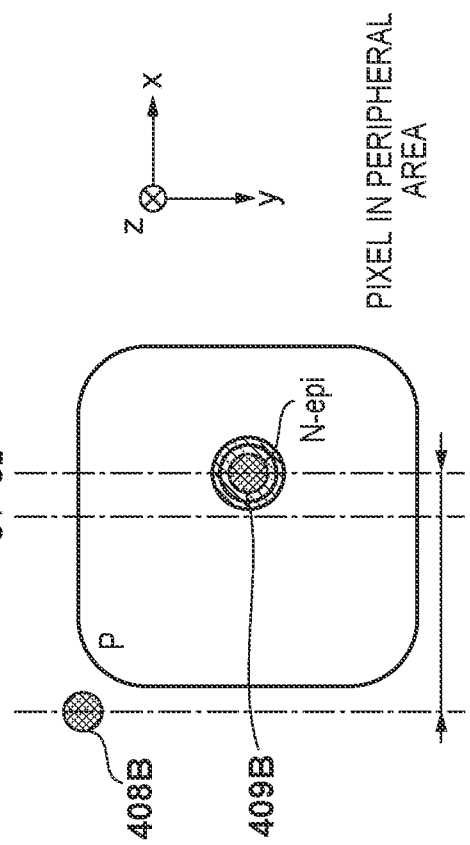
Figure 4G:
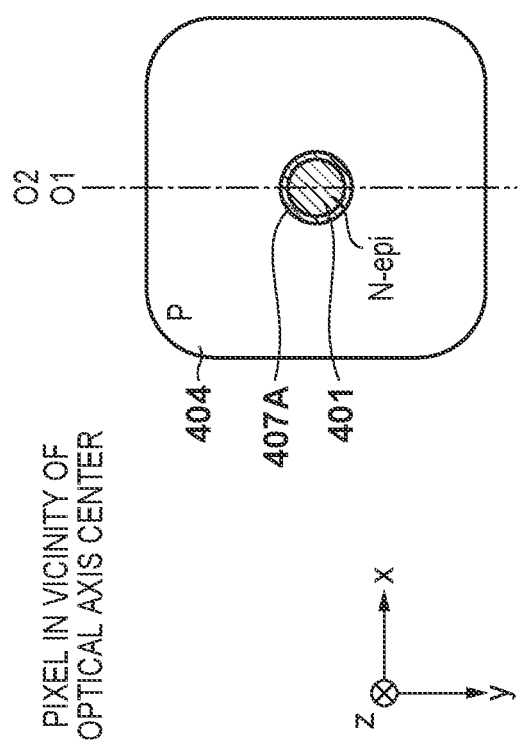
Figure 4H:
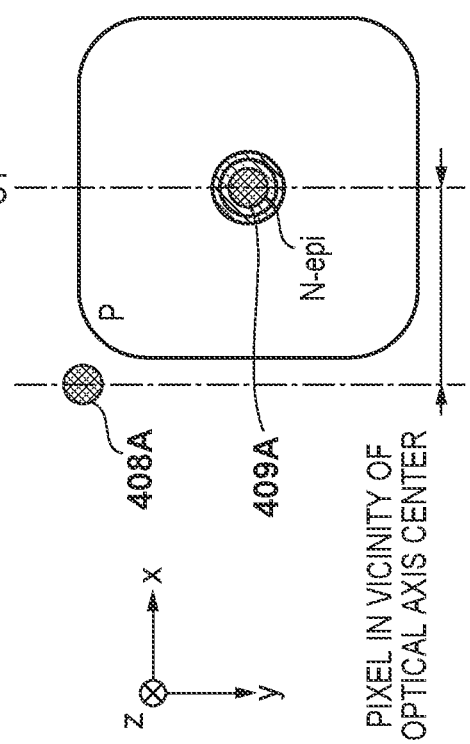

Furthermore, as shown in FIGS. 4A and 4B and the D-D' cross-sectional views of FIGS. 4E and 4F, P 404 is formed so as to extend to the vicinity of the center of the photodiode, and the avalanche breakdown region 407A is formed in a region in which P 404 and N+ 402 are close to each other. Here, as shown in FIGS. 4A and 4B, N+ 402 is formed to have a small area in a horizontal cross-section so that the area in which the avalanche breakdown region 407A is formed is small. This can lower the probability that a crystal defect and the like inside the silicon substrate exist inside the avalanche breakdown region 407A. As a result, it is possible to lower the rate of occurrence of pixels in which a dark current, which is generated due to a crystal defect and the like inside the avalanche breakdown region, undergoes avalanche breakdown and is detected with a high frequency (defective pixels). Furthermore, even if the area of the avalanche breakdown region 407 is made small, it is possible to detect photons incident on a wide range inside the pixel by increasing the area of N-epi 401, which is the light-receiving region.

In FIGS. 4A and 4B, light incident on the central position O1 of N-epi 401, which is the light-receiving region, is indicated by an arrow. Whereas a light ray incident on the pixel 301 located at the optical axis center is parallel to the z-axis as shown in FIG. 4A, a light ray incident on the pixel 302 in the peripheral area 303 is inclined with respect to the z-axis as shown in FIG. 4B.

At this time, the positions where photons incident at the respective angles on N-epi 401, which is the light-receiving region, are photoelectrically converted depend on a probability distribution of exponential functions that are determined by the absorption coefficient of silicon. Here, the average positions where photons incident on the respective pixels are photoelectrically converted are denoted by 408A and 408B. These average positions 408A and 408B are equivalent to penetration depths by which photons incident at the respective angles on silicon are photoelectrically converted with a probability of 50%. Provided that a wavelength of incident light is represented by 550 nm, which is a wavelength in the vicinity of the center of a visible light region, these penetration depths are approximately 1 μm.

As shown in FIGS. 4A and 4B, the central position (O1) of the avalanche breakdown region 407A in the pixel 301 located at the optical axis center is immediately above the average position 408A where incident photons are photoelectrically converted. Also, the central position (O2) of the avalanche breakdown region 407B in the pixel 302 in the peripheral area 303 is immediately above the average position 408B where incident photons are photoelectrically converted. That is, the respective pixels have substantially the same distance from the average position where incident photons are photoelectrically converted to the avalanche breakdown region, and a reduction in the photon detection sensitivity in a pixel that is arranged in a position distant from the optical axis center can be suppressed. This is because it is possible to suppress an increase in the probability that the electrons generated by photoelectric conversion disappear due to recombination during drift transport to the avalanche breakdown region.

Furthermore, in pixels in the peripheral areas also, as the direction and position in which the electrons generated by photoelectric conversion enter the avalanche breakdown region are the same as in the pixel located at the optical axis center, the electrons can achieve acceleration necessary for the occurrence of avalanche breakdown in the avalanche breakdown region. This can also suppress a reduction in the photon detection sensitivity in a pixel that is arranged in a position distant from the optical axis center.

As described above, in the present embodiment, the horizontal cross-sectional position of the first conductive type region (N+ 402), at which the avalanche breakdown region (high-field region) is formed, is controlled so that incident photons pass through the average position of photoelectric conversion and a straight line parallel to the optical axis of the imaging optical system passes through the avalanche breakdown region. Note that the average position where incident photons are photoelectrically converted can be obtained as a distance obtained from the incident angle of a light ray incident on the central position of N-epi 401, which is the light-receiving region, and the penetration depth of a representative wavelength of incident light (e.g., 550 nm) (the amount of shift from the center of the light-receiving region). Note that this is one example, and the average position where incident photons are photoelectrically converted in each pixel may be obtained using other methods.

For example, the average position where incident photons are photoelectrically converted may be obtained in consideration of all light beams incident on the pixel via the imaging optical system. Note that when the imaging optical system has a variable diaphragm or when the imaging optical system is replaceable, it is sufficient to calculate the average position in consideration of a light beam incident on the pixel in connection with the reference imaging optical system and the reference f-number.

Furthermore, in the present embodiment, the average position where incident photons are photoelectrically converted is obtained using the penetration depth of 550 nm, which is the wavelength in the vicinity of the center of the visible light region; however, it is possible to use the penetration depth of a wavelength corresponding to the highest spectral transmittance of the color filters provided in the respective pixels. In this case, the horizontal cross-sectional position of the first conductive type region (N+ 402), at which the avalanche breakdown region (high-field region) is formed, varies among pixels provided with color filters of different colors, even if the pixels have the same image height.

Furthermore, as stated earlier, the horizontal cross-sectional position of the first conductive type region (N+ 402), at which the avalanche breakdown region (high-field region) is formed, may be controlled not only in the x-axis direction, but also in the y-axis direction.

The present embodiment has presented an example in which the position of the center O2 of N+ 402 is shifted from the reference, that is, the central position O1 of N-epi 401. However, the reference for the amount of shift of the center O2 of N+ 402 is not limited to the central position O1 of N-epi 401. For example, when the pixels 108 are arranged cyclically at a predetermined pixel pitch, a midpoint of a straight line connecting the centers of neighboring pixels may be used as the reference. Furthermore, the center of a region defined by P404 embedded around the photodiode or the guard ring 403 may be used as the reference. Alternatively, the positions of electrodes for applying the voltage V2, which are cyclically arranged inside the pixel region 101, may be used as the reference. When the electrode positions are used as the reference as shown in FIGS. 4G and 4H as an example, the amount of shift is prescribed by distances from electrodes 408A and 408B that apply the voltage V2 to electrodes 409A and 409B that apply the voltage V1.

Next, a description is given of exemplary applications of the first embodiment to an image sensor in which microlenses are provided in respective pixels.

FIGS. 5A and 5B are x-z cross-sectional views of photodiodes in a pixel 301' located at the optical axis center and a pixel 302' in a peripheral area 303 in a first exemplary modification of the first embodiment. In FIGS. 5A and 5B, the constituents that are the same as those in FIGS. 4A to 4H are given the same reference signs thereas, and a description thereof will be omitted.

As shown in FIGS. 5A and 5B, each pixel includes a microlens (ML) 406 in front of a color filter 405 when viewed along an incident light ray. ML 406 collects light that is formed into an image by an imaging optical system into N-epi 401, which is a light-receiving region. Here, in each of FIGS. 5A and 5B, light incident on N-epi 401 after passing through the center of ML 406 is indicated by an arrow. Also in the configuration in which each pixel includes ML 406, the horizontal cross-sectional position of N+ 402 is controlled so that avalanche breakdown regions 407A, 407B are formed immediately above average positions 408A, 408B where photons incident on N-epi 401 via ML 406 are photoelectrically converted. Therefore, similarly to the configurations shown in FIGS. 4A to 4H, it is possible to suppress a reduction in the efficiency of detection of incident photons in pixels in peripheral areas of a pixel region. Note that the above has described a case where the average position 408B where photons are photoelectrically converted is more distanced from the optical axis of the microlens in pixels in the peripheral areas. However, even when the relationship between a change in a pixel position and a change in a distance between the average position 408 and the optical axis of the microlens is different, the avalanche breakdown region 407 can be formed immediately above the average position 408 where photons are photoelectrically converted.

Note that FIGS. 4A to 4H and FIGS. 5A and 5B exemplarily show the configurations in which the central position O2 of the avalanche breakdown region (N+ 402) is shifted by the distance L from the reference, that is, the central position O1 of N-epi 401, which is the light-receiving region. However, the central position of ML 406, CF 405, or P 404 may be used as the reference. Furthermore, when a non-illustrated wire opening and light-shielding member are provided, the central position of the wire opening and the light-shielding member may be used as the reference. Note that in FIGS. 4A to 4H, avalanche breakdown can occur as long as the dimension of N+ 402 in the x-axis direction is approximately 1.2 μm. Furthermore, when the size of the high-field region is changed in accordance with a pixel pitch, N+ 402 is configured in such a manner that the percentage of its size (area) to a pixel size (area) is 40% or less if the pixel pitch corresponds to a pixel of 10 μm or less.

Figure 6A:
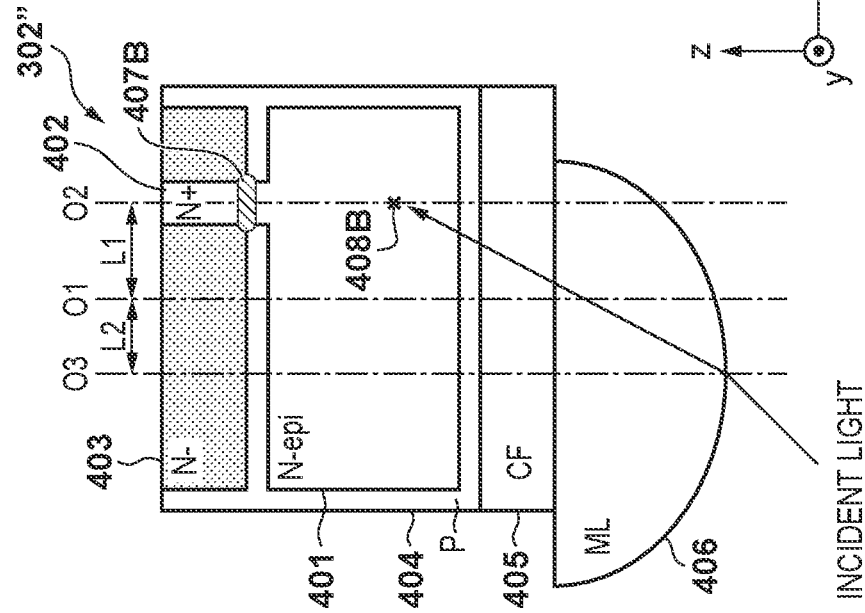
FIGS. 6A and 6B are cross-sectional views of photodiodes in another exemplary modification of the first embodiment.
Figure 6B:
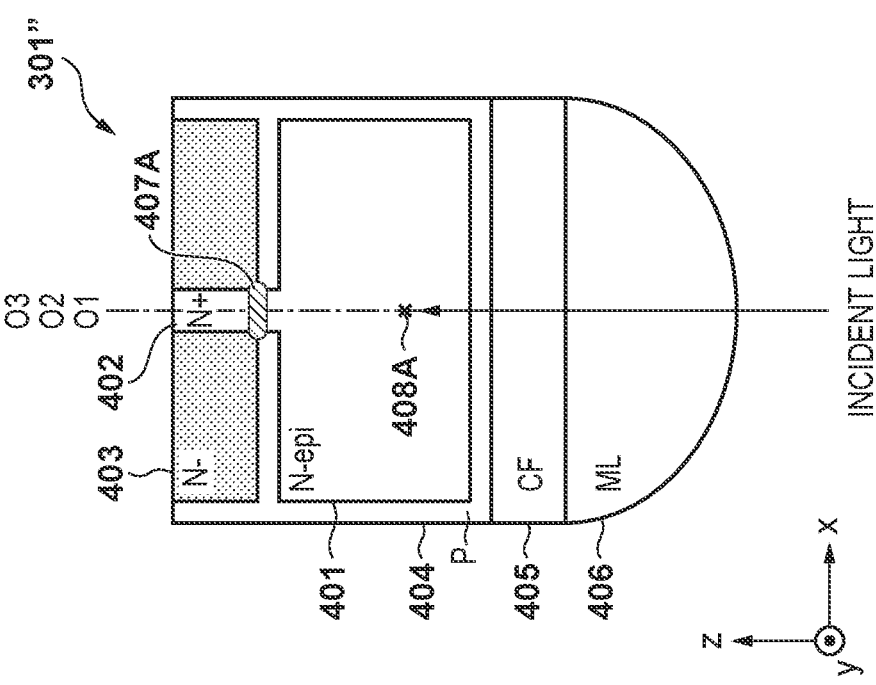

FIGS. 6A and 6B are x-z cross-sectional views of photodiodes in a pixel 301" located at the optical axis center and a pixel 302" in a peripheral area 303 in a second exemplary modification of the first embodiment. In FIGS. 6A and 6B, the constituents that are the same as those in FIGS. 4A to 4H or FIGS. 5A and 5B are given the same reference signs thereas, and a description thereof will be omitted.

In the exemplary modification shown in FIGS. 5A and 5B, ML 406 is placed in the same position in each individual pixel regardless of the arrangement position of the pixel (e.g., the center of the light-receiving region and the center of ML 406 of the pixel have the same x- and y-coordinates). In contrast, in the present exemplary modification, in the x-axis direction of the pixel 302" in the peripheral area 303, a central position O3 of ML 406 is arranged in such a manner that it is shifted by L2 from a central position O1 of N-epi 401 as shown in FIG. 6B.

More specifically, in the pixel 302" in the peripheral area 303, the central position O3 of ML 406 is arranged in such a manner that it is shifted from a reference, that is, the central position O1 of the light-receiving region (N-epi 401) in a direction toward the optical axis of the imaging optical system (or the optical axis center of a pixel region) (a leftward direction in the figure). Furthermore, N+ 402, at which an avalanche breakdown region is formed, is formed in such a manner that its central position O2 is shifted from a reference, that is, the central position O1 of the light-receiving region in a direction away from the optical axis of the imaging optical system (or the optical axis center of the pixel region) (a rightward direction in the figure).

This can suppress a reduction in the efficiency of detection of incident photons even when incident light is incident with a significant inclination with respect to the z-axis. Furthermore, when both of N+ 402 and ML 406 are shifted in the opposite directions, the amounts of shift can be reduced compared to when only one of them is shifted. Especially, by reducing the amount of shift L1 of N+ 402, the width of the guard ring N− 403 is reduced due to closeness between N+ 402 and P 404, which is the lateral surface, thereby preventing the occurrence of breakdown on the lateral surface side. Furthermore, reducing the amount of shift L2 of ML 406 can prevent photons incident on the vicinity of a periphery of ML 406 from being blocked by, for example, a non-illustrated element separating structure formed between pixels, and prevent such photons from being incident on a neighboring pixel and causing color mixture. Note that ML 406 and CF 405 may be integrated into one member, and a central position of this member may be shifted. Furthermore, when a non-illustrated wire opening is provided, the wire opening may also be formed in such a manner that it is shifted in the direction toward the optical axis.

Note that when the distance between N+ 402 and P 404 necessary for the prevention of breakdown by the guard ring N− 403 cannot be obtained due to the shifting of N+ 402, the guard ring N− 403 may also be shifted together with N+ 402. Furthermore, similarly to the amount of shift of ML 406, the amount of shift L1 of N+ 402 can also be increased in stages from the center to the periphery of the pixel region 101.

Figure 7A:
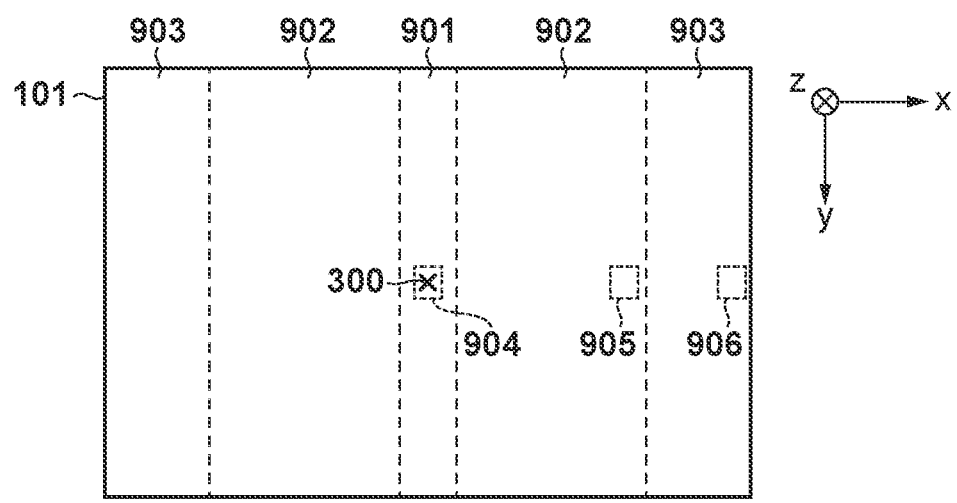
FIGS. 7A to 7D are cross-sectional views of photodiodes in still another exemplary modification of the first embodiment.

FIGS. 7A to 7D are diagrams related to a third exemplary modification of the first embodiment. In the present exemplary modification, a pixel region is divided into three regions, and a combination of positional control for N+ 402 and positional control for ML 406 differs among pixels belonging to discrete regions. FIG. 7A shows an example of division of the pixel region in the present exemplary modification. As can be seen from comparison with FIG. 3, the vicinity of the optical axis center (which is also the vicinity of the image center here) is divided into a near-optical axis center area 901 and intermediate areas 902. Peripheral areas 903 may be the same as the peripheral areas 303 of the first embodiment. For example, boundaries of the respective regions can be determined in such a manner that the intermediate areas 902 include pixels in which light rays are incident on the centers of the pixels at an incident angle (the x-axis direction) that is equal to larger than a first threshold or is smaller than a second threshold, and the peripheral areas 903 include pixels in which light rays are incident on the centers of the pixels at an incident angle that is equal to or larger than the second threshold; however, the boundaries may be determined in accordance with other conditions.

Figure 7B:
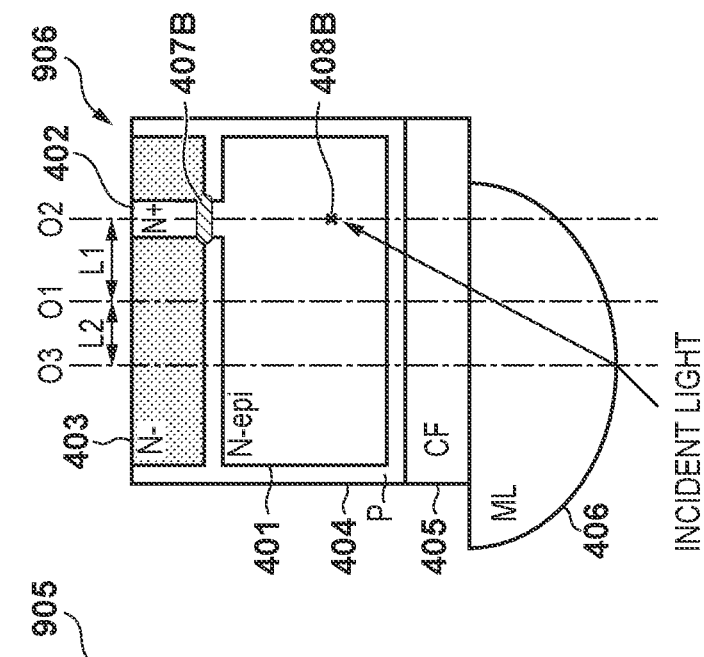
Figure 7C:
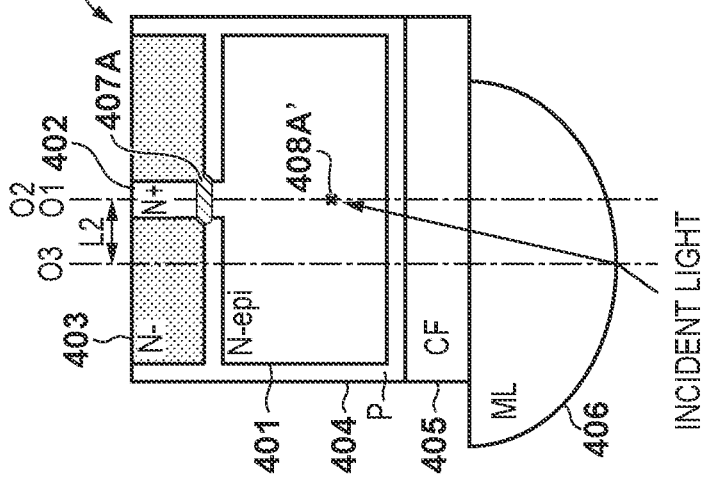
Figure 7D:
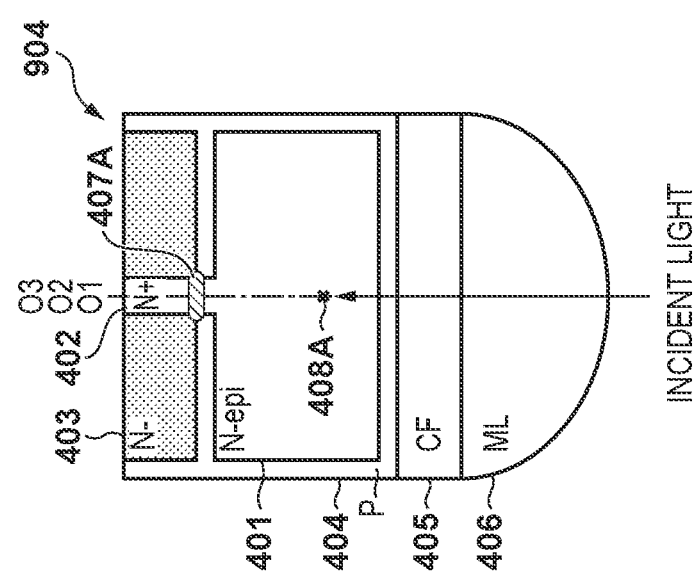

FIGS. 7B to 7D are x-z cross-sectional views of photodiodes in a pixel 904 which is an example of pixels located in the near-optical axis center area 901, a pixel 905 which is an example of pixels located in the intermediate areas 902, and a pixel 906 which is an example of pixels located in the peripheral areas 903. In FIGS. 7A to 7D, the constituents that are the same as those in FIGS. 3 to 6B are given the same reference signs thereas, and a description thereof will be omitted. It will be assumed here that the pixel 904 is a pixel located at the optical axis center.

As shown in FIG. 7B, in the pixel 904 located in the near-optical axis center area 901, ML 406 and N+ 402 are provided in such a manner that a central position O3 of ML 406 and a central position O2 of N+ 402 both match a central position O1 of N-epi 401. In contrast, as shown in FIG. 7C, in the pixel 905 located in the intermediate area 902, ML 406 is provided in such a manner that the central position O3 of ML 406 is shifted by L2 from the central position O1 of N-epi 401 in a direction toward the optical axis center (leftward in the figure). Furthermore, as shown in FIG. 7D, in the pixel 906 located in the peripheral area 903, the shift of the central position O3 of ML 406 shown in FIG. 7C is combined with the shift of the central position O2 of N+ 402. More specifically, the central position O2 of N+ 402 is shifted by L1 from a reference, that is, the central position O1 of N-epi 401 in a direction away from the optical axis center.

As described above, with an increasing distance from the optical axis center, the central position of the microlens is shifted first, and then the central position of N+ 402 is further shifted. In pixels located in the intermediate areas 902 and the peripheral areas 903, a reduction in the photon detection sensitivity can be appropriately suppressed. Note that pixels located in the intermediate areas 902 may be configured in such a manner that the central position O2 of N+ 402 is shifted in place of the central position O3 of ML 406.

The above has described a pixel located in the peripheral area 303 on the right; meanwhile, in a pixel located in the peripheral area 303 on the left inside the pixel region, the average position is shifted in a leftward direction in the figure. However, the shift of O2 and O3 in the direction away from the optical axis center is the same.

As described above, according to the present embodiment, the position of the region in which avalanche breakdown occurs and/or the position of the microlens differs among the plurality of pixels arranged in the pixel region depending on the position of the pixels. More specifically, in pixels that are distant from the optical axis center by a threshold or more, the center of the region in which avalanche breakdown occurs is shifted from the reference, that is, the center of the light-receiving region of the pixels in the direction away from the optical axis center, compared to pixels that do not satisfy such a condition. Alternatively or in addition, in the pixels that are distant from the optical axis center by the threshold or more, the center of the microlens is shifted from the reference, that is, the center of the light-receiving region of the pixels in the direction toward the optical axis center, compared to pixels that do not satisfy such a condition. This can suppress a reduction in the efficiency of photon detection dependent on a pixel position. Note that if light-shielding members are arranged between pixels as a measure against color mixture, it is preferable to shift the light-shielding members as well when shifting the center of the microlens from the center of the light-receiving region of the pixels. Furthermore, other members, such as the color filter provided between the light-receiving region and the microlens of the pixels, may be shifted as well.

Second Embodiment

Figure 8:
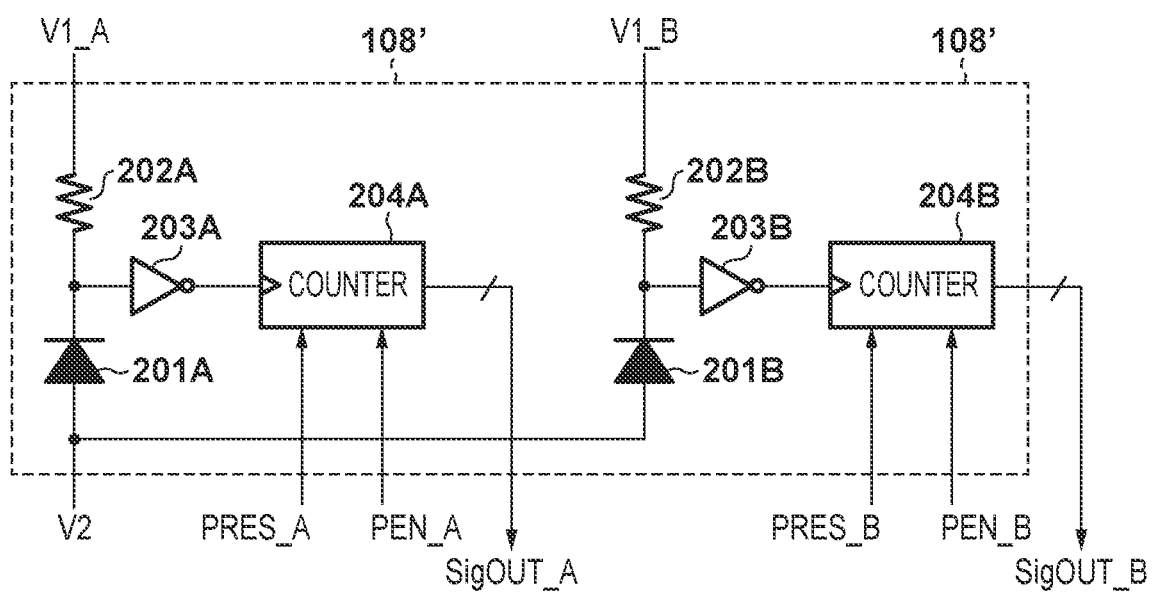
FIG. 8 is an equivalent circuit diagram of a unit pixel in a second embodiment.

Next, a second embodiment of the present invention will be described. In the present embodiment, the present invention is applied to pixels that are configured to include a microlens and a light-receiving region divided into a plurality of regions. FIG. 8 is an equivalent circuit diagram of pixels 108' that are arrayed in a pixel region of an image sensor of the present embodiment. The constituent elements that are similar to those of the pixels 108 in the first embodiment will be given the same reference signs as in FIG. 2, and a description thereof will be omitted.

The pixels 108' included in the image sensor of the present embodiment include a plurality of photodiodes 201A, 201B. Note that each pixel may include three or more photodiodes. The pixels 108' also include quenching resistors 202A, 202B, inverting buffers 203A, 203B, and counter circuits 204A, 204B that respectively correspond to the photodiodes 201A, 201B.

A voltage V1_A (e.g., 3 V) is applied to a cathode terminal of the photodiode 201A via the quenching resistor 202A, and a voltage V1_B (e.g., 3 V) is applied to a cathode terminal of the photodiode 201B via the quenching resistor 202B. On the other hand, the same voltage V2 (e.g., −20 V) is applied to anode terminals of the photodiodes 201A, 201B. As a result, each of the photodiodes 201A, 201B operates in a Geiger-mode, and photon incidence causes the occurrence of an avalanche breakdown phenomenon.

Furthermore, the inverting buffer 203A outputs a voltage change that occurs in association with the occurrence and completion of avalanche breakdown in the photodiode 201A to the counter circuit 204A as a pulse signal. Similarly, the inverting buffer 203B outputs a voltage change that occurs in association with the occurrence and completion of avalanche breakdown in the photodiode 201B to the counter circuit 204B as a pulse signal.

A vertical control circuit 102 (FIG. 1) supplies enable signals (PEN_A, PEN_B) and reset signals (RES_A, RES_B) to the counter circuits 204A, 204B. Values counted by the counter circuits 204A, 204B during a predetermined exposure period are sequentially output to a digital output unit 107 (FIG. 1) as pixel data (SigOUT_A, SigOUT_B).

As will be described later, the photodiodes 201A, 201B share one microlens, and receive light beams from different partial pupils included in an exit pupil of an imaging optical system. Therefore, a defocus amount of the imaging optical system can be obtained by reading out SigOUT_A and SigOUT_B from a plurality of pixels and detecting a phase difference between an image signal formed by SigOUT_A and an image signal formed by SigOUT_B. Furthermore, regarding each individual pixel, pixel data similar to pixel data obtained from the pixels 108 of the first embodiment can be obtained by adding two pieces of pixel data of SigOUT_A and SigOUT_B.

FIGS. 9A and 9B are x-z cross-sectional views of the photodiodes of the pixels in the present embodiment. FIG. 9A shows a configuration of a photodiode of a pixel in the vicinity of the optical axis center, and FIG. 9B shows a configuration of a photodiode of a pixel in a peripheral area. It will be assumed here that the vicinity of the optical axis center and peripheral areas are determined as described in the first embodiment using FIG. 3. Furthermore, FIGS. 9C and 9D are cross-sectional views taken along the line C-C' in FIGS. 9A and 9B, and FIGS. 9E and 9F are cross-sectional views taken along the line D-D' in FIGS. 9A and 9B. In FIGS. 9A to 9F, the constituent elements corresponding to those of the pixels 108 of the first embodiment will be given the same reference signs as in FIGS. 4A to 4H to FIGS. 7A to 7D, and a description thereof will be omitted.

In FIG. 9A, N+ 402A and N+ 402B, which are n-type semiconductor regions serving as first conductive type regions, are formed above N-epi 401, which is a light-receiving region. They respectively function as cathode terminals of the photodiodes 201A, 201B. The voltages V1_A, V1_B are applied to N+ 402A, N+ 402B via the quenching resistors 202A, 202B, respectively. As shown in FIGS. 9C and 9D, N− 403 is formed as a guard ring around N+ 402A, N+ 402B.

P 404 is a p-type semiconductor region serving as a second conductive type region, and functions as anode terminals of the photodiodes 201A, 201B. The voltage V2 is applied to P 404 via a non-illustrated contact electrode. As shown in FIGS. 9C and 9D, P404 exists also in a region between N+ 402A and N+ 402B. Furthermore, as shown in FIGS. 9E and 9F, P 404 is formed so as to extend to the vicinity of N+ 402A, N+ 402B. P 404 shown in each figure is integrally formed. Accordingly, an avalanche breakdown region 1202A is formed in a region in which N+ 402A and P 404 are close to each other, and an avalanche breakdown region 1202B is formed in a region in which N+ 402B and P 404 are close to each other.

FIGS. 9A and 9B schematically show an exit pupil 1204 of the imaging optical system. Reference signs 1203A and 1203A' denote average positions where light that exits a partial pupil region 1205 included in the exit pupil 1204 of the imaging optical system is photoelectrically converted in N-epi 401, which is the light-receiving region, after being incident on the pixel. Also, reference signs 1203B and 1203B' denote average positions where light that exits a partial pupil region 1206 is photoelectrically converted in N-epi 401, which is the light-receiving region, after being incident on the pixel.

The electrons generated at the average position 1203A or 1203A' move to the avalanche breakdown region 1202A by drifting, and undergo avalanche breakdown. On the other hand, the electrons generated at the average position 1203B or 1203B' move to the avalanche breakdown region 1202B by drifting, and undergo avalanche breakdown. The electrons generated by photons incident on an intermediate area between 1203A and 1203B (1203A' and 1203B') move to one of the avalanche breakdown regions 1202A (1202A') and 1202B (1202B') by drifting, and undergo avalanche breakdown.

In FIGS. 9A to 9F also, O1 denotes a central position of N-epi 401, which is the light-receiving region, in the x-axis direction. Also, OA, OB respectively denote central positions of N+ 402A, N+ 402B in the x-axis direction. Furthermore, a distance from O1 to OA is denoted by LA, and a distance from O1 to OB is denoted by LB. As shown in FIG. 9A, N+ 402A, N+ 402B are respectively formed immediately above the average positions 1203A, 1203B where photons incident from the partial pupil regions 1205, 1206 are photoelectrically converted. As a result, the distances from the average positions where photons are photoelectrically converted to the avalanche breakdown regions 1202A, 1202B can be shortened while suppressing the areas of the avalanche breakdown regions 1202A, 1202B. It is thus possible to suppress recombination and disappearance of the electrons generated by the photoelectric conversion before the electrons reach the avalanche breakdown regions 1202A, 1202B, and suppress the failure of the electrons to achieve sufficient acceleration in the avalanche breakdown regions.

On the other hand, in the pixel in the peripheral area shown in FIG. 9B, reference signs 1203A', 1203B' denote average positions where photons incident from the partial pupil regions 1205, 1206 are photoelectrically converted. Compared to the average positions 1203A, 1203B where photons are photoelectrically converted in the pixel of FIG. 9A that is located at the optical center, the average positions 1203A', 1203B' are shifted in a direction away from the optical axis of the imaging optical system. Therefore, in the pixel in the peripheral area, N+ 402A, N+ 402B are formed in such a manner that they are shifted in the direction away from the optical axis of the imaging optical system compared to the pixel in the vicinity of the optical axis center. In FIG. 9B, OA', OB' denote central positions of N+ 402A, N+ 402B in the x-axis direction. Here, provided that a distance from O1 to OA' is denoted by LA' and a distance from O1 to OB' is denoted by LB', the following relationships are satisfied: LA'<LA, and LB'>LB.

As shown in FIG. 9B, in the pixel in the peripheral area also, N+ 402A, N+ 402B are formed immediately above the average positions 1203A', 1203B' where photons incident from the partial pupil regions 1205, 1206 are photoelectrically converted. Accordingly, the avalanche breakdown regions 1202A', 1202B' are also respectively formed immediately above the average positions 1203A', 1203B' where photons are photoelectrically converted. As a result, the distances from the average positions where photons are photoelectrically converted to the avalanche breakdown regions 1202A', 1202B' can be shortened while suppressing the areas of the avalanche breakdown regions 1202A', 1202B'. It is thus possible to suppress recombination and disappearance of the electrons generated by the photoelectric conversion before the electrons reach the avalanche breakdown regions 1202A', 1202B', and suppress the failure of the electrons to achieve sufficient acceleration in the avalanche breakdown regions.

Furthermore, in the pixel in the peripheral area also, the orientations and positions in which the electrons generated by the photoelectric conversion enter the avalanche breakdown regions can be the same as those in the pixel in the vicinity of the optical axis center. Therefore, the electrons can sufficiently achieve acceleration necessary for the occurrence of avalanche breakdown in the avalanche breakdown regions. This can suppress a reduction in the efficiency of detection of incident photons in the pixel in the peripheral area of the pixel region. Moreover, the difference in the efficiency of detection of incident photons between the two photodiodes inside a pixel can be reduced.

The above has described a pixel located in the peripheral area 303 on the right; meanwhile, in a pixel located in the peripheral area 303 on the left inside the pixel region, the average positions are shifted in a leftward direction in the figure. However, the shift of O2 in the direction away from the optical axis center is the same. Although the present embodiment has presented an example in which both of the central position of N+ 402A and the central position of N+ 402B in the x-axis direction are shifted, it is possible to adopt a configuration in which only one of them is shifted depending on the incident angle of a light ray from the imaging optical system.

Third Embodiment

Next, a third embodiment of the present invention will be described. In the present embodiment, the present invention is applied to pixels that are configured to include a microlens and a light-shielding film that blocks light from entering a part of a light-receiving region. An equivalent circuit of the pixels included in an image sensor according to the present embodiment is similar to that of the first embodiment (FIG. 2).

The following describes the embodiment in which, in one or more of pixels in an imaging region, focus detection according to a phase-difference detection method can be performed by blocking a part of a light beam incident on a photodiode via the microlens using the light-shielding film.

Figure 10A:
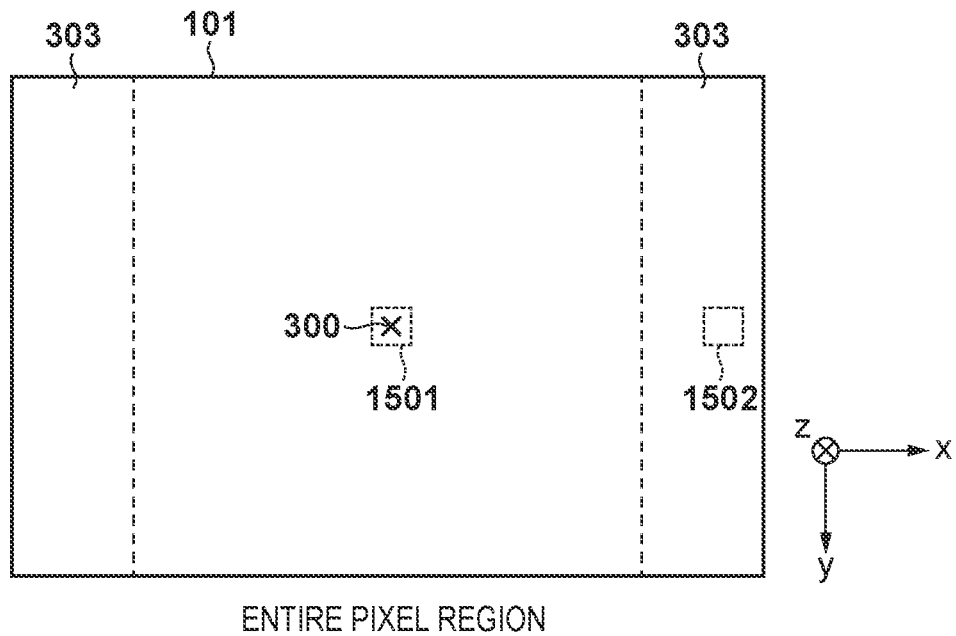
FIGS. 10A to 10C are general configuration diagrams of a pixel region in a third embodiment.
Figure 10B:
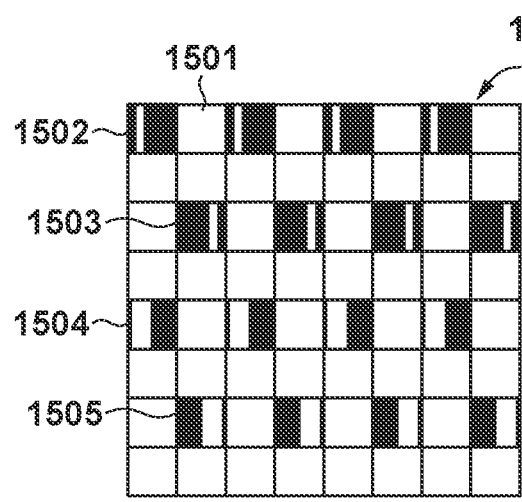
Figure 10C:
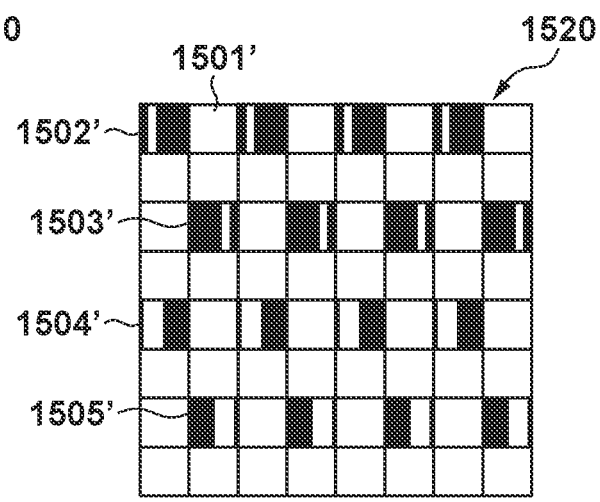
Figures 11D, 11E, 11F:
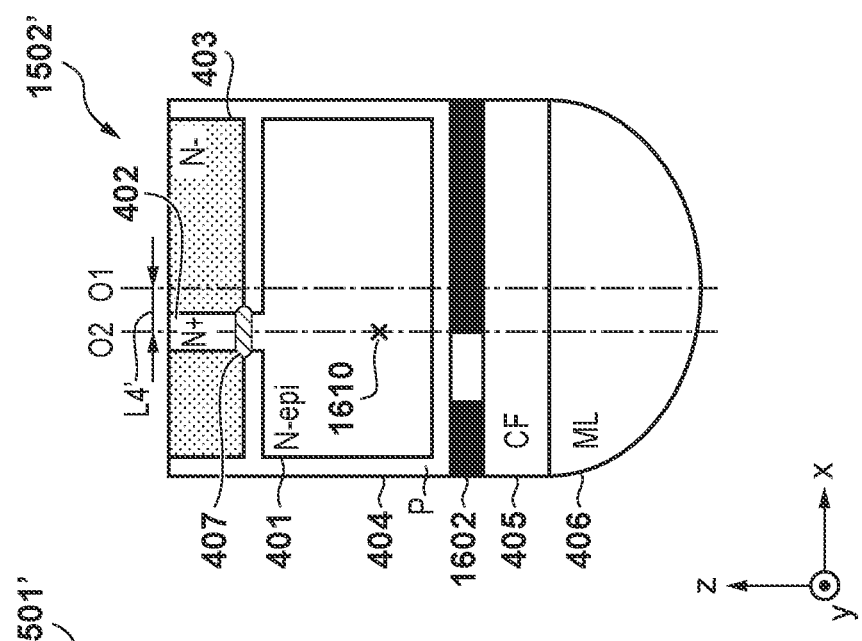

FIG. 10A is a schematic view of a pixel region 101 of the image sensor according to the present embodiment, and the constituent elements that are similar to those of the first embodiment are given the same reference signs as in FIG. 3. In the present embodiment also, the pixel region is divided into the vicinity of the optical center and peripheral areas 303, similarly to the first embodiment. Furthermore, reference sign 1510 denotes a region of 8×8 pixels including the optical axis center, and reference sign 1520 denotes a region of 8×8 pixels included in a peripheral area. FIGS. 10B and 10C are enlarged views of the pixel regions 1510 and 1520, and areas in black denote the light-shielding films.

As a light-shielding film blocks light from entering a part of the light-receiving region of a pixel, light is limited to being incident on the pixel from a specific partial pupil region included in an exit pupil of an imaging optical system. Therefore, in FIG. 10B, light is incident on pixels 1502 and 1503 from different partial pupil regions. Pixels 1502 and 1503 are pixels dedicated to obtaining pixel data for phase-difference detection (pixels for focus detection). A defocus amount of the imaging optical system can be obtained by detecting a phase difference between an image signal generated from pixel data obtained from the plurality of pixels 1502 and an image signal generated from pixel data obtained from the plurality of pixels 1503. On the other hand, pixels 1501, which are not provided with the light-shielding films, are pixels for obtaining normal pixel data (pixels for shooting). Note that pixels 1504 and 1505 show other examples of the light-shielding films with a larger aperture than in the pixels 1502 and 1503. Pixels 1501' to 1505' in FIG. 10C are pixels that respectively correspond to pixels 1501 to 1505 in FIG. 10B. Note that the size of the apertures of the light-shielding films that are actually provided in the pixels may come in one type throughout the entire pixel region.

As shown in FIGS. 10B and 10C, the pixels for focus detection are arranged cyclically in a part or an entirety of the pixel region 101. Note that the illustrated arrangement pattern of the pixels for focus detection is one example, and no limitation is intended in this regard.

FIGS. 11A to 11D are x-z cross-sectional views of photodiodes of the pixels 1501 to 1504 in the vicinity of the optical axis center. On the other hand, FIGS. 11E to 11H are x-z cross-sectional views of photodiodes of the pixels 1501' to 1504' in a peripheral region. Note that in FIGS. 11A to 11H, the constituent elements that are similar to those of the first embodiment are given the same reference signs as in FIGS. 4A to 4H, and a description thereof will be omitted.

As shown in FIGS. 11A to 11H, in the pixels for focus detection 1501 to 1505 and 1501' to 1505', light-shielding films 1601 to 1604 made of aluminum, tungsten, or another metal are provided between a color filter 405 and P 404. Note that in the pixels for shooting 1501 and 1501', the light-shielding films 1601 are provided so as not to restrict the direction of photons incident on the pixels (a pupil region). On the other hand, in the pixels for focus detection 1502 to 1505 and 1502' to 1505', the incident direction of photons is restricted to the direction of passing through aperture areas of the light-shielding films 1601 to 1604.

In FIGS. 11A to 11H also, O1 denotes a central position of N-epi 401, which is the light-receiving region, in the x-axis direction. On the other hand, O2 denotes a central position of N+ 402 in the x-axis direction. An avalanche breakdown region 407 is formed in a section in which N+ 402 and P 404 are close to each other.

First, the position where the avalanche breakdown region 407 is formed in the pixels 1501 to 1504 in the vicinity of the optical axis center will be described with reference to FIGS. 11A to 11D.

As shown in FIG. 11A, in the pixel for shooting 1501, N+ 402 is formed in such a manner that O1 and O2 match. On the other hand, as shown in FIGS. 11B and 11C, in the pixels for focus detection 1502 and 1503, N+ 402 is formed in such a manner that O2 is distanced from O1 by distances L4 and L5, respectively, in the opposite directions. Note that in the pixels in the vicinity of the optical axis center, L4=L5. Furthermore, in the pixel for focus detection 1504 that is configured to receive light via a large partial pupil region compared to the pixels for focus detection 1502, 1503, N+ 402 is formed in such a manner that O2 is distanced from O1 by a distance L6. Note that the direction in which O2 is distanced from O1 is the same as the direction in which the aperture of the light-shielding film is shifted from O1.

Here, reference signs 1605 to 1608 in FIGS. 11A to 11D denote average positions where photons incident on N-epi 401 from the aperture area of the light-shielding film are photoelectrically converted. As stated earlier, due to controlling of the distance between the center O1 of the light-receiving region and the central position O2 of N+ 402, the avalanche breakdown region 407 is formed immediately above the average positions 1605 to 1608 where photons are photoelectrically converted in all of the pixels 1501 to 1504.

Therefore, the distance from the average position where incident photons are photoelectrically converted to the avalanche breakdown region is the same in the pixels for focus detection 1502 to 1504 and the pixel for shooting 1501. Furthermore, the direction and position in which the electrons generated by the photoelectric conversion enter the avalanche breakdown region are also the same in the pixels for focus detection 1502 to 1504 and the pixel for shooting 1501. Therefore, compared to a case where the pixels for focus detection are also formed in such a manner that the central position O2 of N+ 402 matches the center O1 of the light-receiving region, it is possible to suppress a reduction in the efficiency of photon detection in the pixels for focus detection relative to the pixels for shooting.

Next, the position where the avalanche breakdown region 407 is formed in the pixels 1501' to 1504' in the peripheral area will be described with reference to FIGS. 11E to 11H.

In pixels in the peripheral areas 303, the incident angle of light is larger than in the pixel region in the vicinity of the optical axis center. Therefore, average positions 1609 to 1612 where photons incident on N-epi 401, which is the light-receiving region, are photoelectrically converted are shifted in a direction away from the optical axis center (rightward in the figures) compared to the average positions 1605 to 1608, respectively. Therefore, N+ 402 is formed in such a manner that its central position O2 is shifted by L3' to L6' from a reference, that is, the center O1 of the light-receiving region. Note that the following relationships are satisfied: L4'<L4, L5'>L5, and L6'<L6. The above has described pixels located inside the pixel region 1520 in the peripheral area 303 on the right; meanwhile, in pixels located inside a pixel region in the peripheral area 303 on the left, as the average positions are shifted in a leftward direction in the figures, the magnitude relationships between L4 to L6 and L4' to L6' are reversed. However, the shift of O2 in the direction away from the optical axis center is the same.

In the present embodiment also, similarly to the first and second embodiments, a reduction in the efficiency of detection of incident photons can be suppressed in pixels in the peripheral areas.

The present embodiment has described an example in which the position of the avalanche breakdown region varies between pixels in the vicinity of the optical axis center and pixels in the peripheral areas, and in addition, the position of the avalanche breakdown region varies also between pixels for shooting and pixels for focus detection. However, it is possible to adopt a configuration in which the position of the avalanche breakdown region varies only between pixels for shooting and pixels for focus detection. Furthermore, when a plurality of types of pixels for focus detection are arranged in such a manner that the aperture positions of their light-shielding layers are shifted in order to address a positional shift of ML 406 caused by manufacturing error, N+ 402 may be shifted similarly to the avalanche breakdown region that is formed in conformity with the aperture positions of the light-shielding layers.

Although the present invention has been described in detail above based on exemplary embodiments, the present invention is not limited to these embodiments. All modifications encompassed within the description of the claims are included in the scope of the present invention.

Other Embodiments

To facilitate the understanding of the concepts of the invention, the above embodiments have described only positional control for N+ 402 and ML 406 in the x-axis direction. However, positional control for N+ 402 and ML 406 in the y-axis direction can also be performed similarly to the positional control in the x-axis direction. Therefore, the positional control for N+ 402 and ML 406 in the y-axis direction can be performed in place of or in combination with the positional control for N+ 402 and ML 406 in the x-axis direction. When positional control for N+ 402 and ML 406 is performed in both of the x-axis direction and the y-axis direction, the pixel region can be divided into two or more partial regions in accordance with the magnitude of a distance from the optical axis center (the image height). Furthermore, the amounts of shift of N+ 402 and ML 406 may vary on a pixel-by-pixel, rather than them varying on a region-by-region basis.

In the above-described embodiments, it is assumed that N+ 402 is formed in such a manner that the central position O1 of N-epi 401, which is the light-receiving region, in the x-axis direction matches O2 of N+ 402 in the x-axis direction. However, in reality, it is sufficient to form N+ 402 in such a manner that its x-y cross-section (or a p-n junction surface) shown in, for example, FIGS. 4C and 4D includes the x- and y-coordinates of O1.

Similarly, although it is assumed in the above description that N+ 402 is formed immediately above the average position where photons are photoelectrically converted, it is sufficient to form N+ 402 in such a manner that its x-y cross-section (or the p-n junction surface) shown in, for example, FIGS. 4C and 4D includes the x- and y-coordinates of the average position.

Note that the configurations described in different embodiments can be combined as appropriate. For example, in the third embodiment, the position of the microlens may be controlled, and the central position O2 of N+ 402 may be determined based on an average position dependent on the color of the color filter.

Although the central position O2 of the avalanche breakdown region (N+ 402) is shifted in the x-axis and y-axis directions in accordance with the image height of a pixel in each of the above-described embodiments, it may be shifted in the optical axis direction (the z-axis direction).

Figure 12:
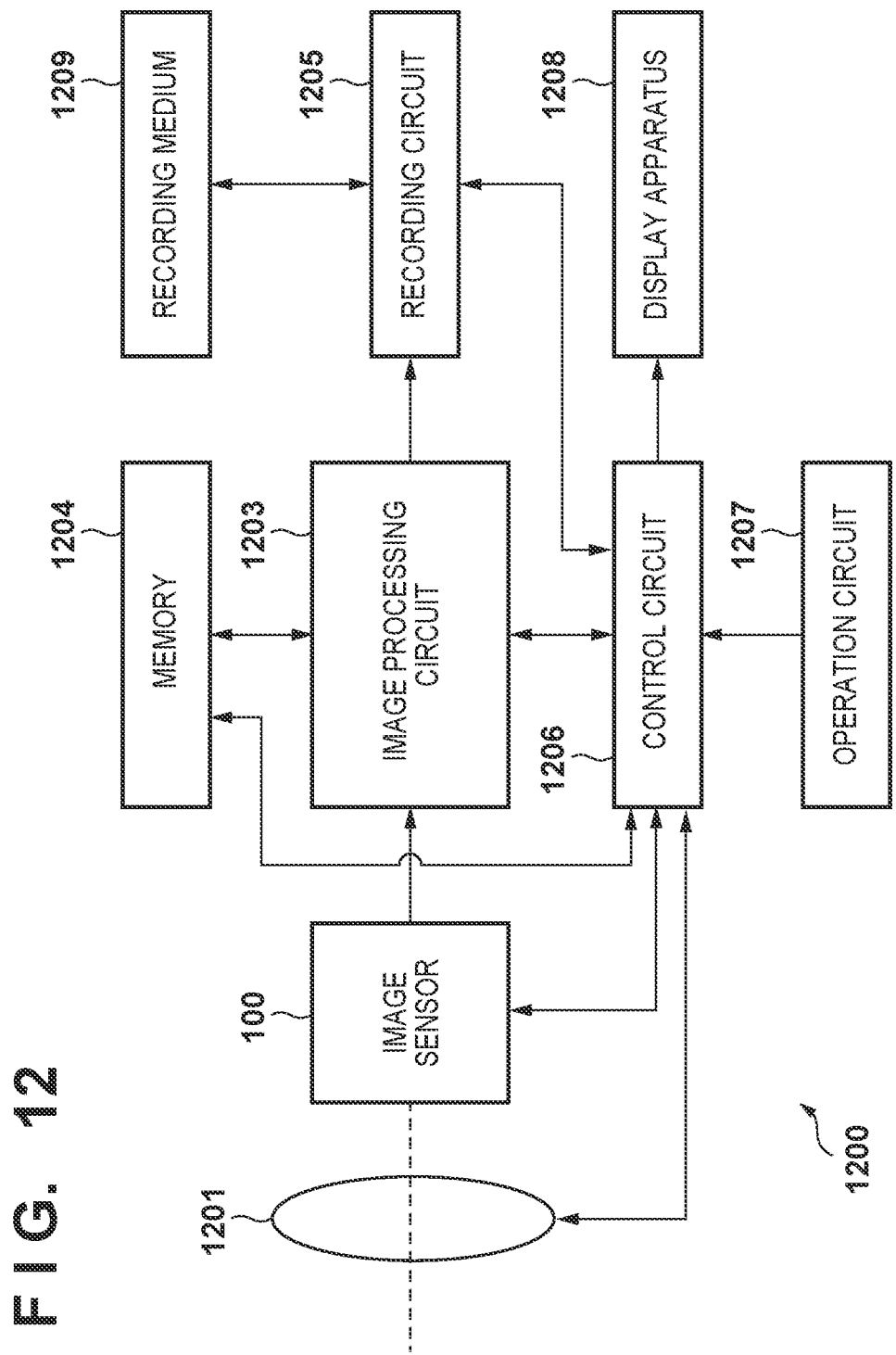
FIG. 12 is an exemplary functional block diagram of a camera to which the image sensor of a photon counting type described in the first to third embodiments is applied.

The image sensor described in each embodiment can be used for a variety of purposes. FIG. 12 is a block diagram showing an exemplary functional configuration of a camera 1200, which is an example of an image capturing apparatus to which the image sensor 100 of a photon counting type described in the first to third embodiments is applied.

A photographing lens 1201 is provided with a plurality of lenses including a focusing lens, a diaphragm, and/or an ND filter. The photographing lens 1201 may be or may not be attachable and removable. The photographing lens 1201 is an imaging optical system that forms an optical image of a subject on an imaging surface of the image sensor 100. The image sensor 100 is provided with, for example, color filters according to a Bayer array of primary colors.

An image processing circuit 1203 generates image data for display and image data for recording by applying predetermined signal processing to image data that has been read out from the image sensor 100. The image processing circuit 1203 also outputs, to a control circuit 1206, information that has been obtained by applying the signal processing to the image data. For example, the image processing circuit 1203 may be a dedicated hardware circuit, such as an ASIC, designed to realize a specific function, or may be configured to realize a specific function through the execution of software by a programmable processor, such as a DSP.

Here, the signal processing applied by the image processing circuit 1203 includes preprocessing, color interpolation processing, correction processing, detection processing, data modification processing, evaluation value calculation processing, and the like. The preprocessing includes signal amplification, reference level adjustment, defective pixel correction, and the like. The color interpolation processing is processing for interpolating values of color components that are not included in image data that has been read out from pixels, and is also referred to as demosaicing processing. The correction processing includes white balance adjustment, processing for correcting image luminance, processing for correcting optical aberration of the photographing lens 1201, color correction processing, and the like. The detection processing includes processing for detecting and tracking a feature region (e.g., a face region and a human body region), processing for recognizing a person, and the like. The data modification processing includes scaling processing, encoding and decoding processing, header information generation processing, and the like. The evaluation value calculation processing is processing for calculating evaluation values that are used in automatic exposure control processing and automatic focus detection processing performed by the control circuit 1206. Note that these are examples of the signal processing that can be implemented by the image processing circuit 1203, and are not intended to limit the signal processing implemented by the image processing circuit 1203.

A memory 1204 is used as a buffer for image data, a work area for the image processing circuit 1203 and the control circuit 1206, and a video memory for a display apparatus 1208. Furthermore, a part of the memory 1204 is nonvolatile, and is used to store programs executed by the control circuit 1206 and setting values thereof, setting values of the camera 1200, data for UI display, and the like.

Under control of the control circuit 1206, a recording circuit 1205 writes and reads out a data file into and from a recording medium 1209, which is a memory card, for example.

The display apparatus 1208 is, for example, a flat panel display, and displays images based on a display signal supplied from the control circuit 1206, such as a live-view image and a menu screen, for example. Note that the display apparatus 1208 may be a touch display.

An operation circuit 1207 is an input device assembly including switches, buttons, a touchpad, a dial, and the like, and is used by a user to issue an instruction to the camera 1200. The input devices included in the operation circuit 1207 are assigned their respective functions in a fixed or dynamic manner. Accordingly, the input devices function as a shutter button, a moving image recording/stop button, a menu button, a directional key, a set button, an operation mode switching dial, and the like. Note that when the display apparatus 1208 is a touch display, software keys realized by a combination of a touchscreen and a GUI are included in the input device assembly included in the operation circuit 1207.

The control circuit 1206 is, for example, a programmable processor, such as a CPU. The control circuit 1206 realizes the functions of the camera 1200 by deploying programs stored in a nonvolatile memory included in the memory 1204 to a system memory of the memory 1204, and controlling the operations of different components by executing the programs. For example, upon detection of an operation on the operation circuit 1207, the control circuit 1206 executes a task corresponding to the detected operation.

The control circuit 1206 controls an operation of the image sensor 100. For example, the control circuit 1206 determines a readout mode of the image sensor 100 in accordance with a shooting mode, and controls an operation of the TG 104 so as to output a control signal corresponding to the determined readout mode. Examples of the shooting mode include a still image readout mode and a moving image readout mode. Furthermore, the control circuit 1206 may determine a readout mode in accordance with the settings of the resolution and frame rate of an image to be shot. For example, the number of pixels to be read out, the number of pixel signals to be added, the number of pixels involved in thinning, and the like may vary depending on a readout mode.

Note that the image sensor 100 according to each embodiment is also applicable for other purposes. For example, the image sensor 100 can be used in sensing of light other than visible light, such as infrared light, ultraviolet light, and X-rays. Furthermore, the image sensor 100 can also be applied to an image capturing apparatus for measuring a distance using a TOF (Time Of Flight) method, and an image capturing apparatus provided in a smartphone, a game device, a personal computer, a tablet device, or the like. Moreover, the image sensor 100 can also be applied to an endoscope, a medical device that captures images of blood vessels, a cosmetic device that examines a skin and a scalp, and a video camera for capturing moving images of sports and actions. In addition, the image sensor 100 can also be applied to, for example, a traffic-purpose camera (e.g., a traffic or marine vessel monitor and a driving recorder), an academic-purpose camera for astronomical observation, specimen examination, or the like, a camera-equipped home appliance, and a machine vision. Especially, the machine vision is not limited to a robot in a factory and the like, and may be utilized in agriculture and fishery.

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-132641, filed on Jul. 12, 2018, and No. 2019-113922, filed on Jun. 19, 2019, which are hereby incorporated by reference herein in their entirety.

What is claimed is:

1. An image sensor comprising:
a pixel region in which a plurality of pixels are arrayed in a matrix, each pixel including a photoelectric conversion region that generates charges through photoelectric conversion of incident light, and an avalanche breakdown region in which avalanche breakdown occurs due to the charges generated by the photoelectric conversion,
wherein
in a plan view of each pixel arrayed in the pixel region, a size of the avalanche breakdown region is smaller than a size of the photoelectric conversion region, and
in at least some of pixels that are arranged in a peripheral region of the pixel region among the pixels arrayed in the pixel region, the avalanche breakdown region is formed in such a manner that a position thereof is shifted with respect to a position of the avalanche breakdown region in pixels arranged in a central region of the pixel region.

2. The image sensor according to claim 1, wherein in a predetermined pixel among the pixels arrayed in the pixel region, the avalanche breakdown region is formed in such a manner that a position thereof is shifted in a direction away from a reference position of the pixel region compared to a position of the avalanche breakdown region in other pixels.

3. The image sensor according to claim 2, wherein each pixel further includes a first conductive type region to which a first voltage is applied, and a second conductive type region which forms a junction surface together with the first conductive type region and to which a second voltage is applied, and
a position where the avalanche breakdown region is formed is controlled in accordance with a position where the first conductive type region or the second conductive type region is formed.

4. The image sensor according to claim 3, wherein in the predetermined pixel, the position where the first conductive type region or the second conductive type region is formed is based on an average position where photoelectric conversion occurs in the photoelectric conversion region.

5. The image sensor according to claim 4, wherein the average position is based on a penetration depth of light of a wavelength corresponding to a color of a color filter provided in each pixel.

6. The image sensor according to claim 2, wherein a magnitude of a positional shift of the avalanche breakdown region is based on a distance between the predetermined pixel and the reference position.

7. The image sensor according to claim 2, wherein the predetermined pixel is a pixel that is at a distance of a threshold or more from the reference position.

8. The image sensor according to claim 2, wherein each pixel further includes a microlens, and
in the predetermined pixel, the microlens is formed in such a manner that a center thereof is at a position that is shifted in a direction toward the reference position.

9. The image sensor according to claim 2, wherein each pixel further includes a microlens,
the predetermined pixel is a pixel that is at a distance of a threshold or more from the reference position, and
in the predetermined pixel and one or more pixels that are at a shorter distance from the reference position than the predetermined pixel, the microlens is formed in such a manner that a center thereof is at a position that is shifted in a direction toward the reference position.

10. The image sensor according to claim 8, wherein a magnitude of the positional shift of the microlens is based on a distance between the predetermined pixel and the reference position.

11. The image sensor according to claim 9, wherein a magnitude of the positional shift of the microlens is based on a distance between the predetermined pixel and the reference position.

12. The image sensor according to claim 2, wherein the predetermined pixel includes a plurality of avalanche breakdown regions, and each of the plurality of avalanche breakdown regions is formed at a position that is shifted in a direction away from the reference position compared to a position of the avalanche breakdown region.

13. The image sensor according to claim 2, wherein the predetermined pixel is a pixel including a light-shielding film that blocks light from entering a part of a light-receiving region, and
a magnitude of the positional shift of the avalanche breakdown region is based on a position of an aperture area included in the light-shielding film.

14. The image sensor according to claim 2, wherein
the reference position is an optical axis center at which an optical axis of an imaging optical system and the pixel region intersect with each other.

15. The image sensor according to claim 2, wherein
the reference position is a center of the pixel region.

16. An image sensor comprising:
a pixel region in which a plurality of pixels are arrayed, each pixel including an avalanche breakdown region in which avalanche breakdown occurs due to charges generated by photoelectric conversion, and an electrode for applying a voltage for the avalanche breakdown,
wherein
in a pixel that is arranged in a first position of the pixel region among the pixels arrayed in the pixel region, the electrode is formed in such a manner that a position thereof is shifted in a direction away from a reference position of the pixel region compared to a position of the electrode in a pixel that is arranged in a second position that is different from the first position.

17. An image sensor comprising:
a pixel region in which a plurality of pixels are arrayed, each pixel including an avalanche breakdown region in which avalanche breakdown occurs due to charges generated by photoelectric conversion,
wherein
in a pixel that is arranged in a first position of the pixel region among the pixels arrayed in the pixel region, the avalanche breakdown region is formed in such a manner that a position thereof is shifted in a direction away from a reference position of the pixel region compared to a position of the avalanche breakdown region in a pixel that is arranged in a second position that is different from the first position.

18. An image capturing apparatus, comprising:
an image sensor; and
a processor for controlling a readout mode of the image sensor,
wherein the image sensor comprises:
a pixel region in which a plurality of pixels are arrayed in a matrix, each pixel including a photoelectric conversion region that generates charges through photoelectric conversion of incident light, and an avalanche breakdown region in which avalanche breakdown occurs due to the charges generated by the photoelectric conversion,
wherein
in a plan view of each pixel arrayed in the pixel region, a size of the avalanche breakdown region is smaller than a size of the photoelectric conversion region, and
in at least some of pixels that are arranged in a peripheral region of the pixel region among the pixels arrayed in the pixel region, the avalanche breakdown region is formed in such a manner that a position thereof is shifted with respect to a position of the avalanche breakdown region in pixels arranged in a central region of the pixel region.

* * * * *